(12) United States Patent
Kodaira et al.

(10) Patent No.: US 9,984,854 B2
(45) Date of Patent: May 29, 2018

(54) ION BEAM PROCESSING METHOD AND ION BEAM PROCESSING APPARATUS

(71) Applicant: CANON ANELVA CORPORATION, Kawasaki-shi (JP)

(72) Inventors: Yoshimitsu Kodaira, Tama (JP); Isao Takeuchi, Kawasaki (JP); Mihoko Nakamura, Chofu (JP)

(73) Assignee: CANON ANELVA CORPORATION, Kawasaki-Shi (JP)

( * ) Notice: Subject to any disclaimer, the term of this patent is extended or adjusted under 35 U.S.C. 154(b) by 620 days.

(21) Appl. No.: 14/563,401

(22) Filed: Dec. 8, 2014

(65) Prior Publication Data

US 2015/0090583 A1    Apr. 2, 2015

Related U.S. Application Data

(63) Continuation of application No. PCT/JP2013/001724, filed on Mar. 14, 2013.

(30) Foreign Application Priority Data

Jun. 29, 2012  (JP) .................................. 2012-146858

(51) Int. Cl.
*H01J 37/30*     (2006.01)
*H01J 37/305*    (2006.01)
(Continued)

(52) U.S. Cl.
CPC .... *H01J 37/3056* (2013.01); *H01J 37/32357* (2013.01); *H01L 21/68764* (2013.01);
(Continued)

(58) Field of Classification Search
CPC ............ H01J 37/32357; H01J 37/3056; H01J 2237/3345; H01J 2237/3347;
(Continued)

(56) References Cited

U.S. PATENT DOCUMENTS 6,238,582 B1  5/2001  Williams et al.
8,475,672 B2  7/2013  Iori et al.
(Continued)

FOREIGN PATENT DOCUMENTS

JP    57-50436 A      3/1982
JP    2000-243340 A   9/2000
(Continued)

OTHER PUBLICATIONS

Office Action in Taiwanese Application No. 102122960 dated Nov. 13, 2015.
(Continued)

*Primary Examiner* — Rodney G McDonald
(74) *Attorney, Agent, or Firm* — Fitzpatrick, Cella, Harper & Scinto

(57) ABSTRACT

The present invention has an objective to provide a processing method and an ion beam processing apparatus capable of inhibiting deposition of redeposited films even for fine patterns. In an embodiment of the present invention, ion beam processing is performed such that an etching amount of an ion beam incident in extending directions of pattern trenches formed on a substrate is made larger than the etching amount of the ion beam incident in other directions. This processing enables fine patterns to be processed while inhibiting redeposited films from being deposited on the bottom portions of the trenches of the fine patterns.

9 Claims, 16 Drawing Sheets

(51) Int. Cl.
  *H01J 37/32* (2006.01)
  *H01L 23/544* (2006.01)
  *H01L 21/687* (2006.01)
  *H01L 43/12* (2006.01)

(52) U.S. Cl.
  CPC .... *H01L 23/544* (2013.01); *H01J 2237/3345* (2013.01); *H01J 2237/3347* (2013.01); *H01L 43/12* (2013.01); *H01L 2223/54426* (2013.01); *H01L 2223/54493* (2013.01); *H01L 2924/0002* (2013.01)

(58) Field of Classification Search
  CPC ............. H01L 21/68764; H01L 23/544; H01L 2223/54426; H01L 2223/54493
  USPC ..................................... 204/192.34
  See application file for complete search history.

(56) References Cited

U.S. PATENT DOCUMENTS

| | | |
|---|---|---|
| 8,481,981 B2 | 7/2013 | Suzuki et al. |
| 8,764,952 B2 | 7/2014 | Sato et al. |
| 2006/0278611 A1* | 12/2006 | Sato .......................... C23F 4/00 216/66 |
| 2010/0096263 A1 | 4/2010 | Sato et al. |
| 2014/0206197 A1 | 7/2014 | Nakagawa et al. |
| 2014/0251790 A1 | 9/2014 | Kodaira et al. |
| 2014/0299465 A1 | 10/2014 | Sato et al. |

FOREIGN PATENT DOCUMENTS

| | | |
|---|---|---|
| JP | 2008-218829 A | 9/2008 |
| JP | 2009-188344 A | 8/2009 |
| JP | 2012-104859 A | 5/2012 |
| WO | 2005/031838 A1 | 4/2005 |
| WO | 2009/107485 A1 | 9/2009 |
| WO | 2010/090127 A1 | 8/2010 |

OTHER PUBLICATIONS

Notice of Preliminary Rejection in Korean Application No. 10-2015-7000131 dated May 18, 2016.

International Search Report in Application No. PCT/JP2013/001724 dated May 2013.

* cited by examiner

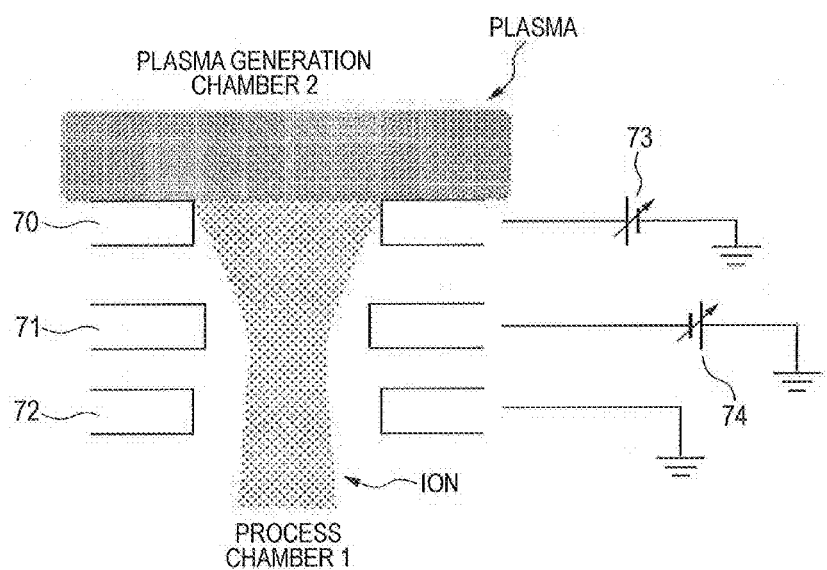
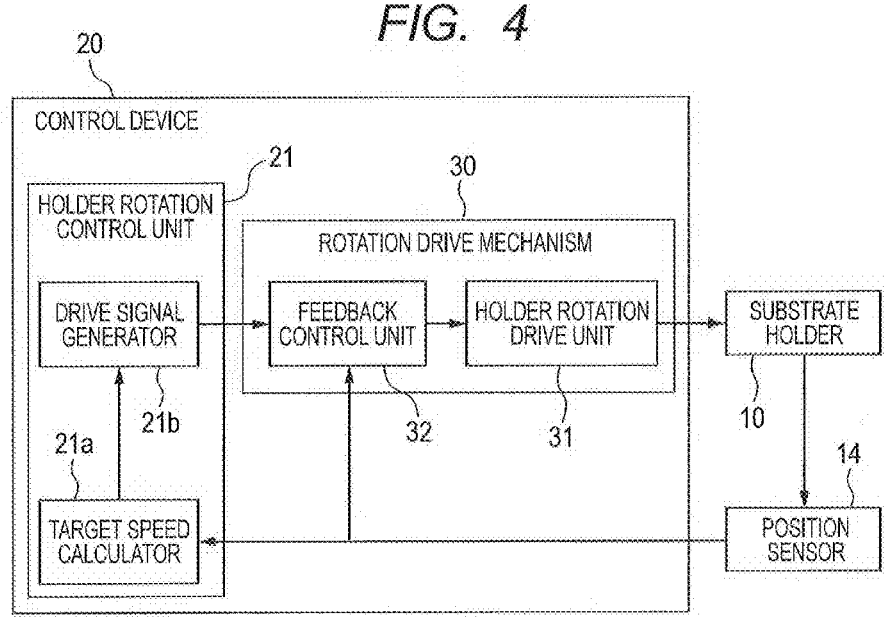

θ270° ←——————————————→ θ90°

ION BEAM PROCESSING METHOD AND ION BEAM PROCESSING APPARATUS

CROSS-REFERENCES TO RELATED APPLICATIONS

This application is a continuation application of International Application No. PCT/JP2013/001724, filed Mar. 14, 2013, which claims the benefit of Japanese Patent Application No. 2012-146858 filed Jun. 29, 2012. The contents of the aforementioned applications are incorporated herein by reference in their entireties.

TECHNICAL FIELD

The present invention relates to an ion beam processing apparatus. In particular, the present invention relates to an ion beam etching apparatus suitable for processing on fine patterns of a semiconductor memory or the like.

BACKGROUND ART

An ion beam etching (hereinafter, also abbreviated as IBE) technique has been widely used for processing a semiconductor memory, a recording device, a magnetic head, and the like (for example, Patent Document 1). The IBE technique forms plasma by inputting power to an electric discharge unit, and then forms an ion beam by extracting ions from the plasma with application of a voltage to a grid. The ion beam is made incident on a substrate, and mainly-physically etches a material on the substrate.

CITATION LIST

Patent Document

Patent Document 1: Japanese Patent Application Laid-Open No. 2008-218829

SUMMARY OF INVENTION

In the foregoing IBE, since a physical etching component is involved at a large proportion, etching progresses by scattering a etched material from the substrate. For this reason, when the IBE is performed in accordance with patterns formed by photolithography, the etched material scattered is redeposited on side walls of the patterns in some cases. To remove these redeposited films, used is a method of performing IBE with a substrate tilted to a travelling direction of the ion beam.

Meanwhile, processing for what are called next generation memories such as MRAM and RRAM (registered trademark) is required to process very fine patterns to improve the recording density. In processing such fine patterns by IBE, an ion beam incident in a direction oblique to a substrate hardly reaches a region around bottom portions of pattern trenches. This phenomenon is specifically explained below by using FIG. 1. FIG. 1 illustrates a state of patterning of a film deposited on a substrate 11. An ion beam I is incident on the substrate 11 in an oblique direction to the substrate 11. If the patterning on the substrate 11 progresses as illustrated in FIG. 1, trenches T formed between elements 110 become so deep that a region around the bottom portions of the trenches T is shaded by the neighboring elements 110 from the ion beam I. For this reason, redeposited films R are difficult to remove sufficiently. In addition, since the ion beam I is hardly incident onto the bottom portions of the trenches T, the etching is difficult.

The present invention was made in order to solve the foregoing problem, and aims at providing a processing method and an ion beam processing apparatus capable of inhibiting deposition of redeposited films even on fine patterns.

The present invention for solving the foregoing problem is a method of processing a substrate mounted on a substrate holder by using an ion beam extracted from a plasma source by a grid. According to a feature of the method, in performing ion beam etching on the substrate located with a tilt to the grid while rotating the substrate in an in-plane direction thereof, ion beam processing is performed such that an etching amount of an ion beam incident from an extending direction of a pattern trench formed on the substrate is made larger than an etching amount of an ion beam incident from another direction.

Moreover, the invention of the present application is an ion beam apparatus including: a plasma source; a grid configured to extract an ion beam from the plasma source; a substrate holder capable of mounting a substrate with a tilt to the grid, and of rotating in an in-plane direction of the substrate; a control unit configured to control a rotation of the substrate on the substrate holder; and a position detection unit configured to detect a rotational position of the substrate. According to a feature of the apparatus, based on a detection result obtained by the position detection unit, the control unit makes a rotational speed of the substrate holder lower when the grid is located on a side in an extending direction of a pattern trench formed on the substrate than otherwise.

Use of the present invention enables fine patterns to be processed while inhibiting deposition of redeposited films on the bottom portions of the trenches of the fine patterns, although the bottom portions have been difficult to process by using conventional IBM with oblique incidence.

BRIEF DESCRIPTION OF DRAWINGS

FIG. 3 is a diagram for explaining a configuration and a function of a grid according to an embodiment of the present invention.

FIG. 4 is a block diagram illustrating a control device according to an embodiment of the present invention.

DESCRIPTION OF EMBODIMENTS

Figure 1:
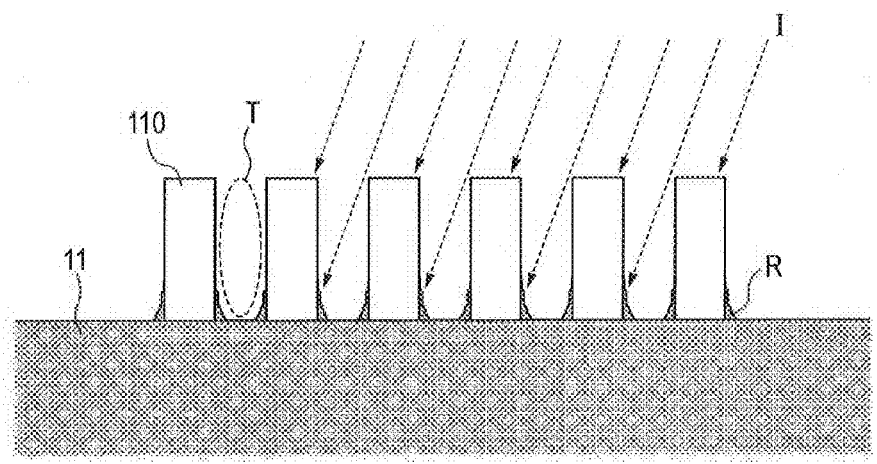
FIG. 1 is a diagram schematically illustrating fine patterns in a conventional IBE processing method.

Hereinafter, embodiments of the present invention are described in reference to the drawings. The present invention is not limited to these embodiments but can be altered as needed without departing from the spirit of the present invention. In the drawings described below, the same reference numerals are given to those having the same functions and duplicated explanation is omitted in some cases.

First Embodiment

Figure 2:
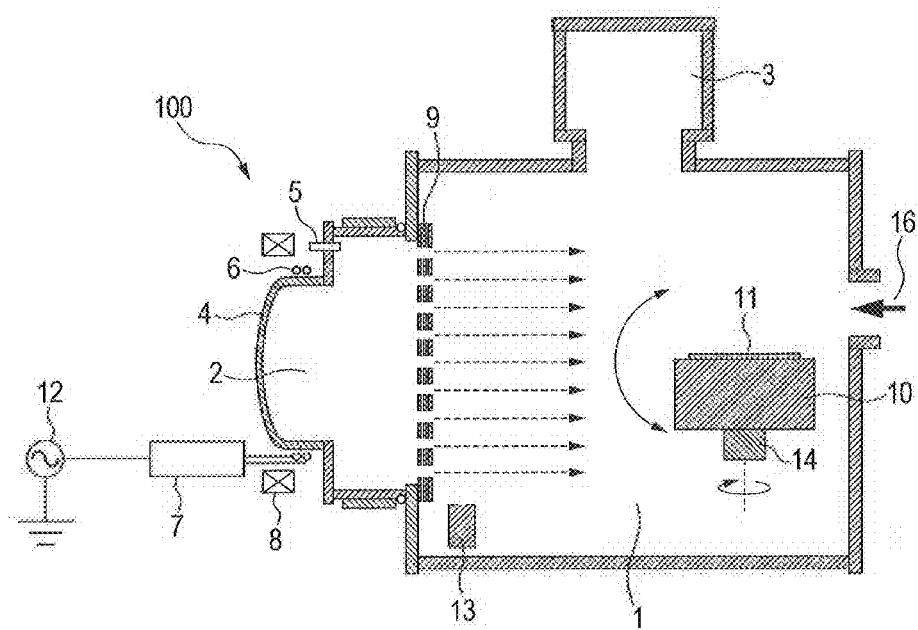
FIG. 2 is a diagram illustrating an ion beam etching apparatus according to an embodiment of the present invention.

FIG. 2 illustrates a schematic diagram of a plasma processing apparatus. An ion beam etching apparatus 100 includes a process space 1 and a plasma generation unit 2 as a plasma source. The process space 1 is provided with an exhaust pump 3. The plasma generation unit 2 is provided with a bell jar 4, a gas introduction unit 5, a RF antenna 6, a matching device 7, and an electromagnet 8, and is also provided with a grid 9 at a boundary with the process space 1.

The grid 9 includes multiple electrodes. In the present invention, the grid 9 includes three electrodes, for example, as illustrated in FIG. 3. A first electrode 70, a second electrode 71, and a third electrode 72 are provided in this order when viewed from a bell jar 4 side. A positive voltage is applied to the first electrode and a negative voltage is applied to the second electrode, so that ions are accelerated due to a potential difference. The third electrode 72 is also called an earth electrode and is grounded. A potential difference between the second electrode 71 and the third electrode 72 is controlled, so that the diameter of the ion beam can be controlled within a predetermined numeric value range by using an electrostatic lens effect. The ion beam is neutralized by a neutralizer 13. This grid 9 is preferably made of a material having resistance to a process gas. As the material for the grid, molybdenum, titanium, titanium carbide or pyrolytic graphite can be cited. Instead, the grid 9 may be obtained by forming a body from a material other than the above listed ones, and then by coating the surface of the body with molybdenum, titanium or titanium carbide.

A substrate holder 10 is provided in the process space 1, and an ESC electrode, not illustrated, is connected to the substrate holder 10. A substrate 11 mounted on the substrate holder 10 is electrostatically chucked and fixed by way of the ESC electrode. As another substrate fixing means, various kinds of fixing means such as a clamp support may be used. The plasma of an etching gas can be generated in the plasma generation unit 2 by introducing the process gas from the gas introduction unit 5 and applying high frequency to the RF antenna 6. Then, a DC voltage is applied to the grid 9 to extract ions in the plasma generation unit 2 in the form of a beam. The ion beam is caused to bombard the substrate 11 to process the substrate 11. The extracted ion beam is electrically neutralized by the neutralizer 13 and then caused to bombard the substrate 11.

The substrate holder 10 is capable of rotating the substrate 11 in its in-plane direction (on its own axis). The substrate holder 10 includes rotation control means for controlling a rotational speed of a substrate, the number of rotations of the substrate, and a tilt of the substrate holder 10 to the grid 9, and means for detecting a rotational position of the substrate. In addition, the substrate holder 10 may include means for detecting a rotation start position of the substrate. In the present embodiment, the substrate holder 10 is provided with a position sensor 14 as position detection means, and is capable of detecting the rotational position of the substrate 11. A rotary encoder is used as the position sensor 14. As the position sensor 14, any configuration can be used as long as it is capable of detecting the rotational position of the rotating substrate 11 like the aforementioned rotary encoder.

Although the present embodiment employs a configuration in which the sensor such as the position sensor 14 detects the rotational position of the substrate 11 held by the substrate holder 10 by directly detecting the rotational position of the substrate holder 10 or the substrate 11, any configuration may be used as long as it is capable of detecting the rotational detection of the substrate 11. For example, the rotational position of the substrate 11 may be obtained in an indirect way such as calculation from the rotational speed and the rotation time of the substrate holder 10.

The rotation start position of a substrate is obtained by detecting an orientation flat or notch of the substrate. Instead, the rotation start position can be obtained more accurately by detecting an alignment mark or a pattern array provided to the substrate. The foregoing position sensor 14 may be used as a substrate rotation start position sensor, or detection means for detecting the alignment mark or the pattern array may be provided in addition to the position sensor 14. As the detection means, an atomic force microscope, an optical measuring or scanning electron microscope, or the like may be provided on a transport path, not illustrated, or a measuring apparatus equipped with the above measuring device may be provided and installed adjacent to the ion beam etching apparatus 100.

The substrate 11 is held on a mount surface of the substrate holder 10 while being kept horizontal. As a material for the substrate 11, a silicon wafer in a disc shape is used, for example. However, the material is not limited to this. The substrate holder 10 is capable of tilting to the ion beam at any angle.

Figure 5:
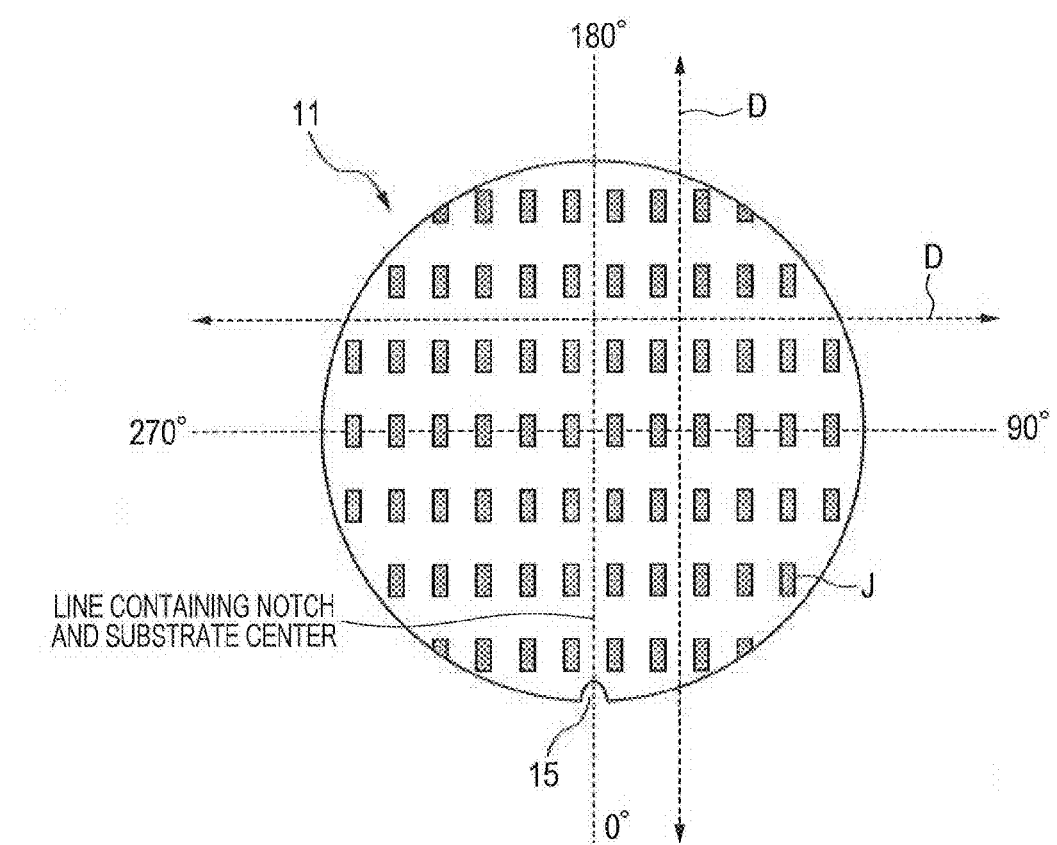
FIG. 5 is a diagram illustrating array directions of rectangular patterns on a substrate.

FIG. 5 illustrates an example of the substrate 11 to which the present invention is applicable. FIG. 5 depicts part of patterns formed on the substrate 11 in an enlarged manner. A larger number of elements J are formed on the substrate 11. A feature of the present invention is that a substrate mounted on the substrate holder is located with a tilt to the grid, and that an exposure dose to an ion beam from extending directions D of pattern trenches illustrated in FIG. 5 is made larger than otherwise by changing the rotational speed of the substrate holder.

Figure 17A:
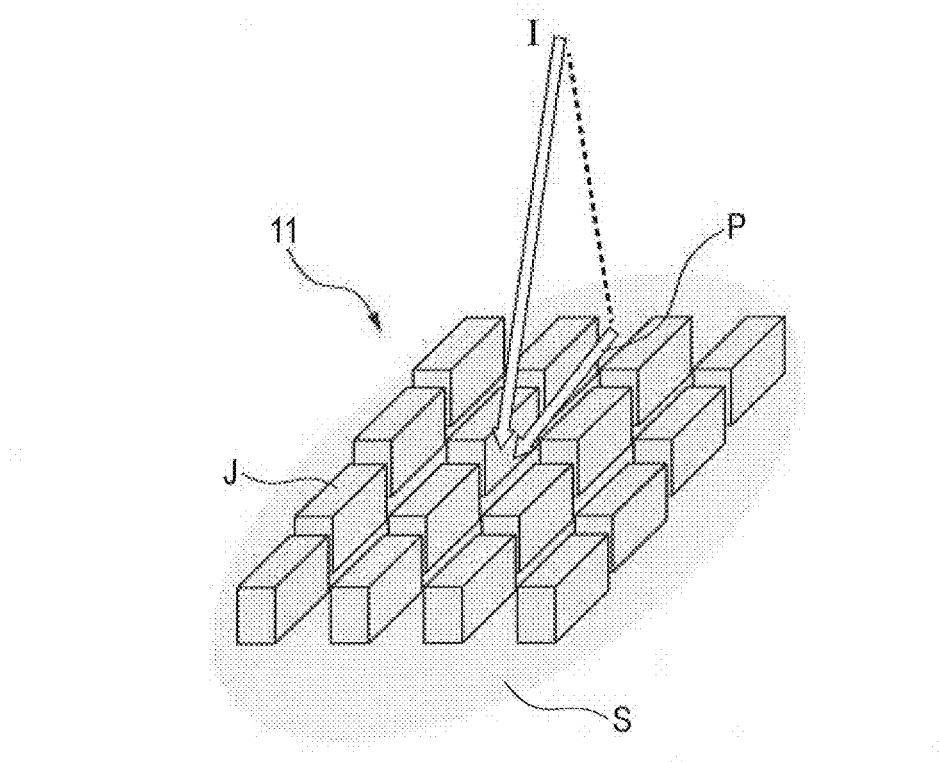
FIG. 17A is a diagram for explaining a projection line of an ion beam on a substrate.
Figure 17B:
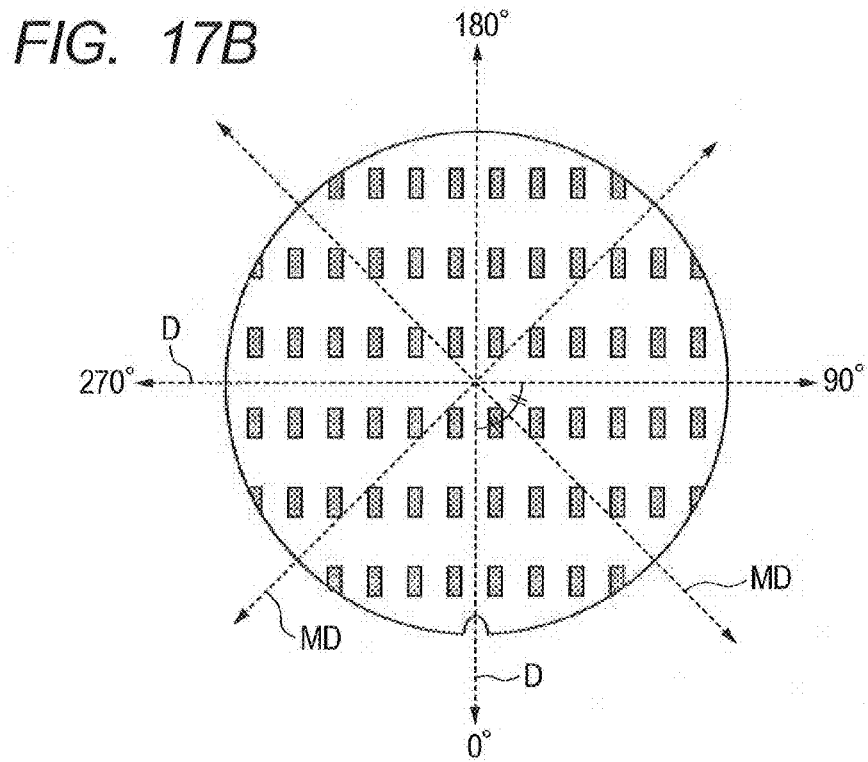
FIG. 17B is a diagram for explaining extending directions of pattern trenches on a substrate.
Figure 17C:
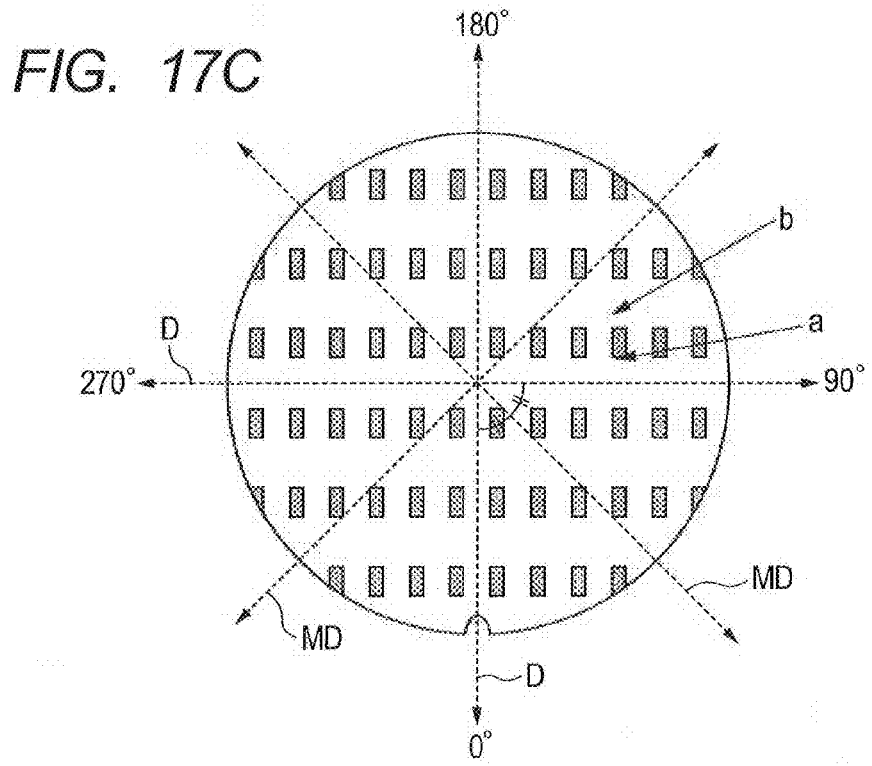
FIG. 17C is a diagram for explaining the extending directions of the pattern trenches on the substrate.

By using FIGS. 17A to 17C, description is provided for a comparison between an etching amount of the ion beam from an extending direction D of pattern trenches and an etching amount of the ion beam from another direction.

Firstly, let us assume a line segment P obtained by projecting an ion beam extracted by the grid 9 onto a plane containing a surface of the substrate 11 as illustrated in FIG. 17A. Then, as illustrated in FIG. 17B, the projected line segment P is decomposed into a component in one of the extending directions D of the pattern trenches and a component in a middle direction MD between the two directions D, and these components of the line segment P are compared with each other to find which of the components in the direction D and the direction MD is larger. In this way, the etching amount of the ion beam from the extending direction D of pattern trenches and the etching amount of the ion beam from the other direction can be compared with each other.

In the present embodiment, as illustrated in FIG. 17B, the extending directions D of the pattern trenches are a direction from 0° to 180°, a direction from 180° to 0°, a direction from 90° to 270°, and a direction from 270° to 90°. Meanwhile, the directions MD, which are middle directions between two directions D, are a direction from 45° to 225°, a direction from 225° to 45°, a direction from 135° to 315°, and a direction from 315° to 135°.

A more specific example is explained by using FIG. 17C. Here, let us assume an ion beam a incident on the substrate 11 in a direction at an angle 100°, and an ion beam b incident on the substrate 11 in a direction at an angle 120°. The ion beam a forms an angle of 10° to the direction D, and forms an angle of 35° to the direction MD. As the component in the direction D and the component in the direction MD of the ion beam a are compared, the component in the direction D is lager because cos 10°:cos 35°≈0.98:0.82

On the other hand, the ion beam b forms an angle of 30° to the direction D, and forms an angle of 15° to the direction MD. As the component in the direction D and the component in the direction MD of the ion beam b are compared, the component in the direction MD is lager because cos 30°:cos 15°≈0.87:0.97. Accordingly, it can be said that the ion beam a is an ion beam incident from the pattern-trench extending direction, whereas the ion beam b is an ion beam incident from the middle direction.

In other words, if the line segment P obtained by projecting an ion beam onto the plane containing the surface of the substrate 11 is closer to an extending direction D of pattern trenches than to a middle direction MD between the extending directions D of the pattern trenches, the etching amount is dominant in the extending direction D of the pattern trenches. Hence, if the projected line segment P for an ion beam is closer to an extending direction D of the pattern trenches than to a middle direction MD, it can be said that the ion beam is incident from the extending direction of the pattern trenches Then, to locate the substrate 11 with a tilt to the grid 9 specifically means to locate the grid 9 and the substrate 11 at such positions that the normal to the substrate 11 at the center crosses the normal to the grid 9 at the center at predetermined angles. More specifically, this means to set an angle of the substrate 11 to the grid 9 within a range from 0° to 90° (exclusive of 0° and 90°), where 0° is an angle formed between the normal to the grid 9 at the center and the normal to the substrate holder 10 at the center when the grid 9 and the substrate 11 are parallel to each other, and 90° is an angle formed when the normal to the substrate 11 at the center and the normal to the grid 9 at the center cross each other at perpendicular angles. As the angle thus set, an angle preferably used is 10° to 40° when a main purpose is to etch the bottom portions of the pattern trenches, and is 30° to 80° when a main purpose is to remove redeposited films on the side walls of the elements or the like, or to etch the side walls.

In the present invention, the tilt angle of the substrate 11 to the grid 9 is defined as 0° in the state where the grid 9 and the substrate 11 are parallel to each other, as described above. Moreover, the substrate 11 is symmetrical with respect to the center point in the surface of the substrate 11, and is rotated about the center point. For this reason, when the substrate 11 is tilted from the state at the tilt angle of 0° by a predetermined angle, the angle is equivalent in all tilt directions. More specifically, when a certain direction is defined as + and an opposite direction is defined as − in the state where the tilt angle is 0°, a tilt at +30° is equivalent to a tilt at −30°.

Hence, the value of the angle is described as a positive value in principle in the specification of the present application.

Note that the normal to the grid 9 at the center is a line extending perpendicularly from the center point of the grid having a circular shape. In general, the substrate 11 is mounted on a position where the normal to the substrate 11 at the center crosses the normal to the grid 9 at the center.

When the grid 9 has a shape other than the circular shape, for example, a regular hexagonal shape or a regular octagonal shape, the center point is a center intersection point of diagonal lines connecting opposed corners. In the case of a regular pentagonal shape or a regular heptagonal shape, the center point is an intersection point of perpendicular lines extending from the corners to the opposed sides. Moreover, when the substrate 11 is offset from the normal to the grid 9 at the center, the center point of the grid 9 is also shifted according to the offset amount of the substrate 11.

To put it differently, the normal to the grid 9 at the center in the present invention is a line segment along a traveling direction of an ion beam extracted by the grid 9.

Here, needless to say, the aforementioned center points of the grid 9 and the substrate 11 may vary within a very small range where such variations have almost no influence on the process steps on the substrate 11.

Exposure to the ion beam from the extending directions of the pattern trenches makes it possible to reduce influence of shadows of neighboring patterns, and thereby to process fine patterns while removing redeposited films on the bottom portions of the pattern trenches.

Next, in reference to FIG. 4, description is provided for a control device 20 included in the ion beam etching apparatus 100 of the present embodiment and configured to control the foregoing constituents. FIG. 4 is a block diagram illustrating the control device in the present embodiment.

The control device 20 in the present embodiment includes a general computer and various kinds of drivers, for example. More specifically, the control device 20 includes a CUP (not illustrated) that executes various processing operations such as calculation, control and judgment, a ROM or HDD (not illustrated) where to store various control programs to be executed by the CPU, and the like. In addition, the control device 20 includes a non-volatile memory or the like (not illustrated) such as a RAM, a flash memory or an SRAM, where to temporarily store data such as data under a processing operation by the CPU and input data. With this configuration, the control device 20 executes ion beam etching in accordance with a given program stored in the aforementioned ROM or the like, or commands from a higher level apparatus. Various kinds of process conditions such as an electric discharge time, an electric discharge power, a grid application power, a process pressure, and the rotation and the tilt of the substrate holder 10 are controlled in accordance with the commands. Moreover, it is also possible to acquire output values of sensors such as a pressure gauge (not illustrated) for measuring a pressure inside the ion beam etching apparatus 100 and the position sensor 14 as the position detection means for detecting the rotational position of the substrate, so that the ion beam etching can be controlled according to the conditions of the apparatus.

Moreover, the control device 20 includes a holder rotation control unit 21 as the rotation control means for controlling the rotational speed of the substrate 11 according to the rotational position detected by the position sensor 14. The holder rotation control unit 21 includes a target speed calculator 21a, and a drive signal generator 21b, and has a function to control the rotational speed of the substrate 11 by controlling the rotation of a rotation unit of the substrate holder 10 according to the rotational position of the substrate based on the positional relationship between the rotational position of the substrate 11 and the grid 9. The control device 20 is configured to receive information on the rotational position of the substrate 11 from the position sensor 14. When the control device 20 receives the above-mentioned information on the rotational position, the target speed calculator 21a calculates a target rotational speed for the current rotational position of the substrate 11 on the basis of a value of the current rotational position outputted from the position sensor 14 detecting the rotational position of the substrate 11. The calculation of the value of the target rotational speed is made possible, for example, by storing a correspondence relationship between the rotational position of the substrate 11 and the target rotational speed as a map in advance. On the basis of the target rotational speed calculated by the target speed calculator 21a, the drive signal generator 21b generates a drive signal for adjusting the rotational speed to the target rotational speed, and outputs the drive signal to a rotation drive mechanism 30. The control device 20 is configured to send the rotation drive mechanism 30 the drive signal generated by the drive signal generator 21b.

In the example of FIG. 4, the rotation drive mechanism 30 includes a holder rotation drive unit 31, such as a motor, configured to drive the substrate holder 10, and a feedback control unit 32 configured to determine an operation value of the holder rotation drive unit 31 based on a deviation between a target value and an actual value (rotational position or rotational speed) outputted from the position sensor 14. The rotation drive mechanism 30 drives the substrate holder 10 by using a servo mechanism. However, the feedback control is not an essential constituent of the present invention, and the motor may be any one of a DC motor and an AC motor. The rotation drive mechanism 30 rotates the substrate holder 10 by driving the holder rotation drive unit 31 based on the drive signal received from the control device 20.

Next, description is provided for an operation of the ion beam etching apparatus 100 of the present invention illustrated in FIG. 2, and an ion beam etching method implemented by using this apparatus.

As a substrate to be processed by the ion beam etching apparatus 100 according to the present embodiment, a substrate is prepared in which rectangular patterns, for example, are formed at regular intervals in a matrix-like form with long-side and short-side ends of the patterns aligned with each other as illustrated in FIG. 5. The substrate 11 is mounted on the substrate holder 10 inside the process space 1 through a substrate transport port 16 by not-illustrated transport means, for example, a handling robot provided to a neighboring vacuum transport chamber. The substrate transport port 16 includes a gate valve, not illustrated, and the gate valve is configured to isolate the process space 1 and the neighboring vacuum transport chamber from each other so as not to mix their atmospheres with each other. For the mounted substrate 11, the rotation start position of the substrate is detected by using the notch or orientation flat. Instead, the rotation start position is detected in such a way that an alignment mark provided to the substrate 11 is read by an optical camera or the like. The rotation start position may be detected before the substrate 11 is mounted on the substrate holder 10, or may be detected after the substrate 11 is mounted on the substrate holder 10. In the following ion beam etching, the control on the rotational speed of the substrate 11 according to the positional relationship between the grid 9 and the substrate 11 is performed based on the detection result of the rotation start position of the substrate 11.

Subsequently, a gas for electric discharge, such as Ar, is introduced into the inside of the plasma generation unit 2 from the gas introduction unit 5. In the case of performing reactive ion beam etching, an alcohol gas, a hydrocarbon gas, a carbon oxide gas or the like is introduced into the inside of the plasma generation unit 2.

Thereafter, an electric discharge power supply 12 supplies high frequency power, and the plasma generation unit 2 performs electric discharge. Then, with application of a voltage to the grid 9, the grid 9 extracts ions from the plasma generation unit 2 to form an ion beam. The ion beam extracted by the grid 9 is neutralized by the neutralizer 13 to be electrically neutral. The neutralized ion beam is caused to bombard the substrate 11 on the substrate holder 10 to perform ion beam etching.

When the substrate 11 is mounted on the substrate holder 10, the ESC electrode operates to cause the substrate to be fixed with electrostatic chucking. The substrate 11 mounted on the substrate holder 10 is tilted appropriately for a process position, for example, is tilted at 20° with respect to the grid 9. As the tilt angle, a certain angle is determined by taking into account pattern settings on the substrate, the process gas, the process pressure, the plasma density and the like.

After the substrate holder 10 on which the substrate 11 is mounted is tilted to the grid 9, the substrate holder 10 starts to rotate in the in-plane direction of the substrate 11. The position sensor 14 detects the rotational position of the substrate 11, and the holder rotation control unit 21 performs control according to the detected rotational position, thereby controlling the rotational speed of the substrate 11 according to the rotational position detected by the position sensor 14.

Figure 6:
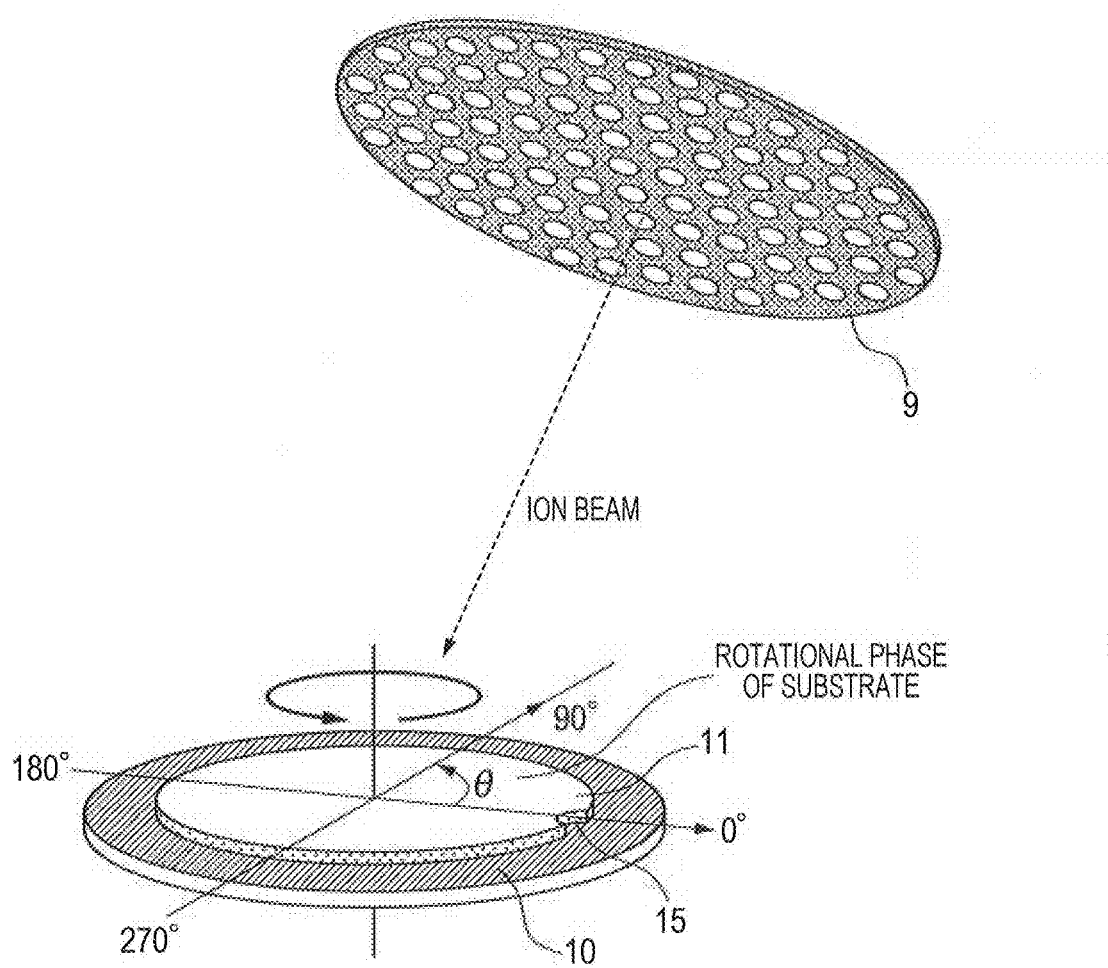
FIG. 6 is a diagram for explaining a positional relationship between a grid and a substrate and a phase of the substrate according to an embodiment of the present invention.
Figure 7A:
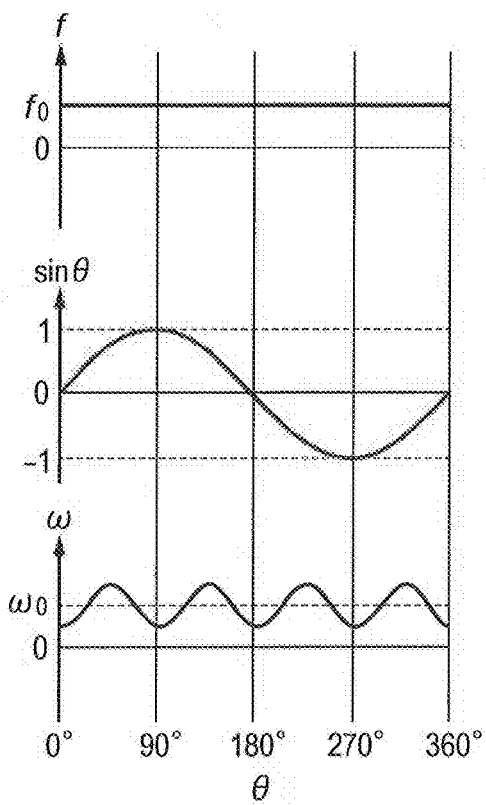
FIG. 7A is an explanatory diagram according to an embodiment of the present invention where a rotational speed of a substrate rotation is controlled and a substrate (substrate holder) is rotated continuously.

Hereinafter, the control of the rotational speed of the substrate 11 is described in more details. FIG. 6 is a diagram for explaining the positional relationship between the grid 9 and the substrate 11 and the phase of the substrate 11 in the present embodiment. FIG. 7A is an explanatory diagram illustrating a control map of the rotational speed of a substrate in an ion beam etching method according to the present embodiment.

By using FIGS. 5 and 6, description is provided for the relationship between the grid 9 and the rotational position of the substrate 11 in the present embodiment. The substrate 11 is mounted on the rotatable substrate holder 10, and the substrate holder 10 is tilted to the grid 9 during ion beam etching. Here, let us consider a state where rectangle-shaped patterns are arranged at regular intervals with the long-side and short-side ends of the patterns aligned with each other as illustrated in FIG. 5. More specifically, assuming that vertical axes each denote an axis parallel to a line passing through the center of the substrate 11 from the notch 15 of the substrate 11, the patterns are arrayed on the substrate with the long sides of the rectangle-shaped patterns aligned with the vertical axes. Then, as illustrated in FIG. 6, the rotational phase (rotational angle) θ of the substrate is defined with the notch 15 used as a base point. Specifically, the rotational phase θ at which the ion beam is incident in the extending directions of the trenches along the long sides of the patterns is 0° on the notch 15 side and 180° on the opposite side. In addition, the rotational phase θ at which the ion beam is incident in the extending directions of the trenches along the short sides of the patterns is defined as 90° and 270° from the notch 15 side in the clockwise direction. The rotation start point of the substrate, the pattern shape and the pattern array directions are defined herein for the sake of convenience, but are not limited to those mentioned above.

In an example of the ion beam etching method using the apparatus according to the present embodiment, the rotational speed y of the substrate is controlled such that the rotational speed can be a sine wave with respect to the rotational phase θ of the substrate as illustrated in FIG. 7A and the following formula (1):

$$y = A\sin(4(\theta - \alpha) + B \tag{1}$$

$$A = a \cdot B \tag{2}$$

More specifically, the holder rotation control unit 21 as the rotation control means of the present invention calculates the rotational speed as a sine function which cycles four times more than the rotational angle θ of the substrate 11 on the basis of the above formula (1). Here, A denotes an amplitude of the rotational speed, and is a product of a base speed B and a variation rate a as presented in Formula (2). In addition, a denotes a phase difference. The distributions of the etching amount and a taper angle in the surface of a substrate can be optimized for each ion beam incident angle by changing the variation rate a and the phase difference α. Here, the rotational phase θ of the substrate has a range of $0° \leq \theta - 360°$.

In the example of FIG. 7A, the substrate rotational speed y relative to the substrate rotational phase θ is presented under the settings of the base speed B at $\omega_0$, the variation rate a at a given numeric value of 0 or more, and the phase difference α at 22.5°. In this case, the rotation frequency (rotational speed) of the substrate becomes lowest when the notch 15 of the substrate 11 is located at the positions at 0°, 90°, 180°, and 270°.

Figure 9A:
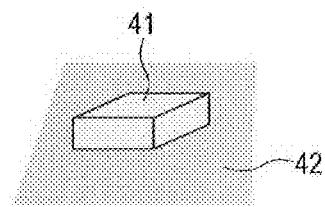
FIG. 9A is a diagram schematically illustrating a photoresist on a substrate before etching processing.
Figure 9B:
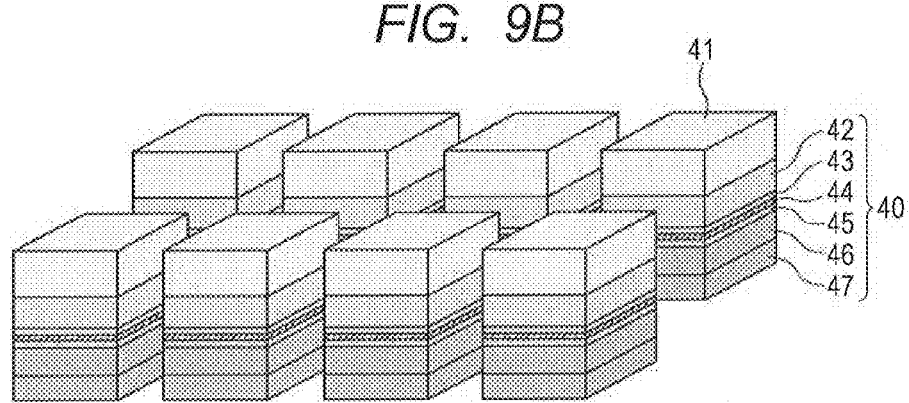
FIG. 9B is a diagram schematically illustrating an array of TMR elements for MRAM.

Here, specific operations and effects produced by changing the rotational speed depending on the rotational phase are described by using FIG. 7A and FIGS. 9A and 9B.

In FIG. 9A, 41 denotes a photoresist and 42 denotes an upper electrode which forms the uppermost surface of a metal multilayer film to be processed by ion beam etching. Here, 41 is not necessarily the photoresist, but may be anything that can function as a mask in the processing of ion beam etching. Here, let us consider the case where TMR elements 40 in a rectangular parallelepiped shape are formed from the state in FIG. 9A by ion beam etching as illustrated in FIG. 9B.

Here, as illustrated in FIG. 7A, the substrate rotational speed is lowered when the substrate is opposed to the grid 9 at a rotational position in an extending direction of the trenches along the long sides of the patterns, i.e., at the rotational position at 0° where the notch 15 is located. Thus, the ion beam is incident along the long sides of the patterns and sufficiently etches the trenches between the patterns. Then, the rotational speed of the substrate is lowered in the same manner at the position where the substrate is rotated by an angle of 180°. In this way, the etching evenly progresses along the long-side directions of the patterns down to the bottom portions of the pattern trenches. For the short-side directions of the patterns, which are the other extending directions of the pattern trenches, the rotational speed is lowered when the rotational position is at 90° and 270°, and thereby the etching can be carried out along the patterns down to the bottom portions of the trenches while inhibiting deposits. Thus, the trenches between the rectangular patterns are exposed to the ion beam in the four directions along the trenches of the patterns. As a result, the trenches surrounding the outer peripheries of the rectangles are etched down to the bottom portions. In this process, if the etching amount varies between the long-side trenches and the short-side trenches, for example, if there is such a shape difference that the long-side trenches are shallow whereas the short-side trenches are deep, the rotational speed on the long side is further lowered to increase the incident dose of the ion beam. Consequently, the depth of the trenches is made even and fine patterns can be processed uniformly in shape.

In the present embodiment, the control map illustrated in FIG. 7A may be stored in advance in a memory such as a ROM included in the control device 20. In the case where the control map is stored in the memory in advance as described above, the target speed calculator 21a can operate as follows. Specifically, when receiving the information on the rotational position of the substrate 11 from the position sensor 14, the target speed calculator 21a refers to the above control map which is illustrated in FIG. 7A and stored in the memory, extracts the rotational speed corresponding to the current rotational angle θ of the substrate 11 to acquire the target rotational speed, and outputs the acquired target rotational speed to the drive signal generator 21b. Thus, when the substrate 11 is opposed to the grid 9 at a rotational angle θ of 0°, 90°, 180°, and 270° and is exposed to the ion beam from the extending directions of the pattern trenches, the rotational speed of the substrate 11 can be controlled to become lowest. On the other hand, when the substrate 11 located at a rotational angle θ of 45°, 135°, 225°, and 315° and is exposed to the ion beam from not-extending directions of the pattern trenches, the rotational speed of the substrate 11 can be controlled to become highest.

Figure 18:
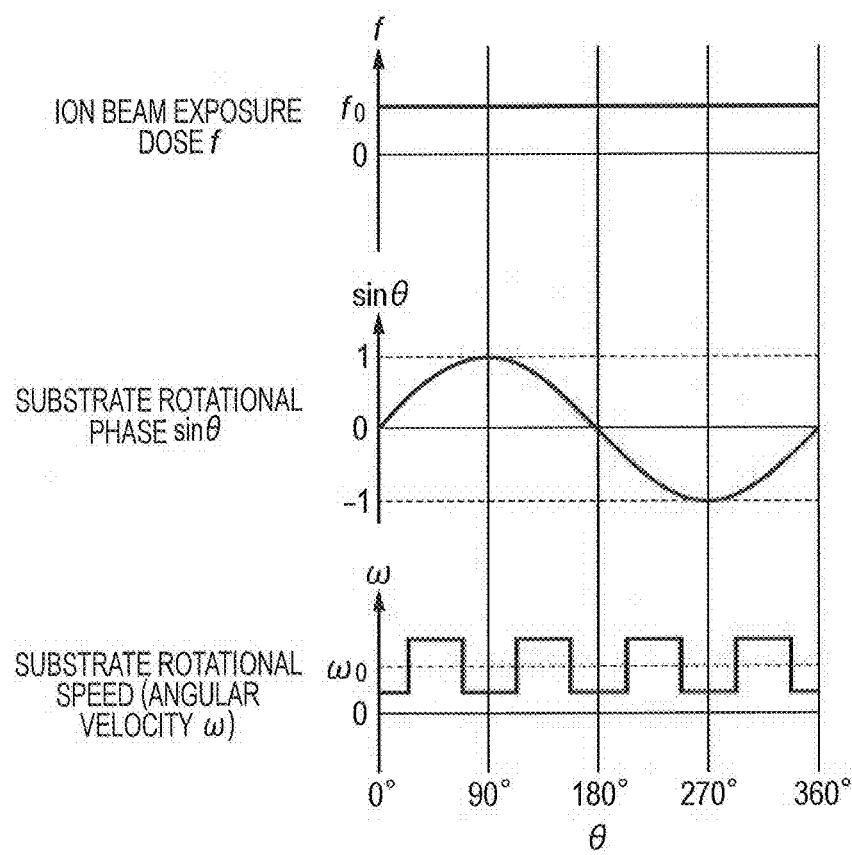
FIG. 18 is a diagram for explaining a relationship among a positional relationship between a grid and a substrate, the phase of the substrate, and the rotational speed of the substrate according to an embodiment of the present invention.

The rotational speed of the substrate holder 10 may be changed in a manner other than the sine function illustrated in FIG. 7A. For example, as illustrated in FIG. 18, the rotational speed may be changed by using two values indicating a first speed and a second speed which is higher than the first speed. Specifically, the rotational speed of the substrate is set at the first speed when the rotational angle of the substrate 11 is within ranges of 0° to 22.5°, 67.5° to 112.5°, 157.5° to 202.5°, 247.5° to 292.5°, and 337.5° to 360. Meanwhile, the rotational speed of the substrate is set at the second speed when the rotational angle of the substrate 11 is within ranges of 22.5° to 67.5°, 112.5° to 157.5°, 202.5° to 247.5°, and 292.5° to 337.5°.

Instead, the rotational speed may be changed stepwise such that the rotational speed of the substrate 11 can become lowest at θ of 0°, 90°, 180°, and 270°, and can become highest at θ of 45°, 135°, 225°, and 315°.

Figure 8:
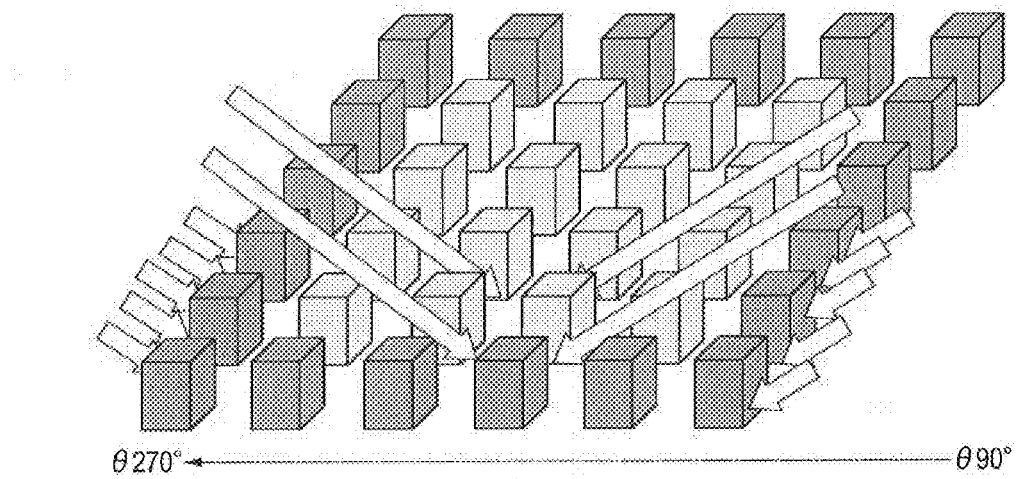
FIG. 8 is a diagram schematically illustrating a state where ion beams are incident on a substrate.

As described above, what is important in the present embodiment is that the effects of the present invention can be obtained by locating the substrate 11 mounted on the substrate holder 10 with a tilt to the grid 9 and by lowering the rotational speed of the substrate so that the exposure dose to the ion beam from the extending directions of the pattern trenches can be large. To make the uniformity in shape favorable, it is preferable to set an equal rotational speed for rotational positions symmetric with respect to the substrate 11 (for example, at 135° and 315°). FIG. 8 illustrates an example of a state of exposure to the ion beams from the extending directions of the pattern trenches. The patterns located at the outermost periphery of the arrayed patterns tend to be etched more than the patterns on the inner side. To further improve the uniformity in pattern shape, dummy patterns may be formed at the outermost periphery of the patterns.

EXAMPLE 1

FIGS. 9A and 9B are explanatory diagrams for illustrating TMR elements which are to be used for MRAM and each include upper and lower electrodes. As illustrated in FIG. 9B, a basic layer structure of a TMR element 40 includes an upper electrode 42, a magnetization free layer 43, a tunnel barrier layer 44, a magnetization fixed layer 45, an antiferromagnetic layer 46, and a lower electrode 47. For example, the magnetization fixed layer is made of a ferromagnetic material, the tunnel barrier layer is made of a metal oxide (magnesium oxide, alumina, or the like) insulating material, and the magnetization free layer is made of a ferromagnetic material.

The TMR element 40 is formed by the steps of: stacking the foregoing metal films on a substrate by a deposition method such as sputtering; patterning a photoresist 41 on the stacked metal films (the uppermost layer is the upper electrode 42, in this case) as illustrated in FIG. 9A; and transferring the patterning to the metal films to thereby process the TMR elements by ion beam etching as illustrated in FIG. 9B. Use of the ion beam etching apparatus and the ion beam etching method of the present embodiment enables device isolation from densely-arrayed fine patterns of the TMR elements by inhibiting etching products from being redeposited on the bottom portions of the patterns.

Second Embodiment

In the first embodiment, the incident angle of the ion beam from the grid 9 to the substrate 11 is adjusted and the rotational speed of the substrate holder 10 is controlled to be lowered such that the exposure dose to the ion beam from the extending directions of pattern trenches can become large as described above. The rotation method of the substrate holder 10 may be either continuous rotation or intermittent pulse rotation. In the present embodiment, a mode of the intermittent pulse rotation is explained.

Figure 7B:
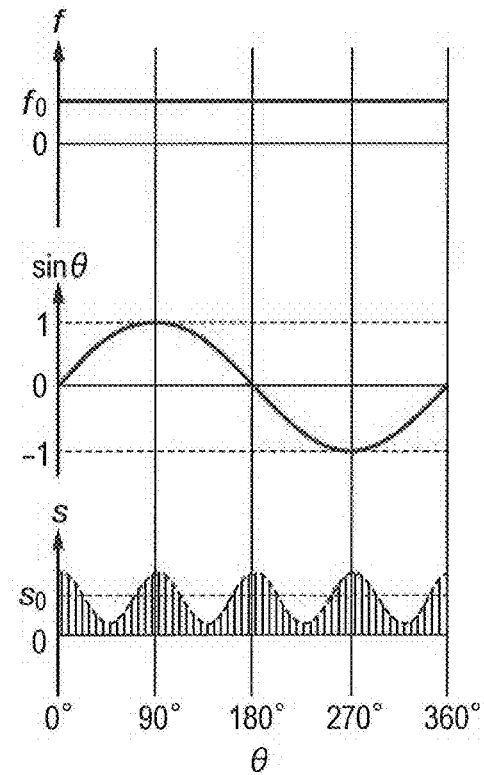
FIG. 7B is an explanatory diagram according to the embodiment of the present invention where the rotational speed of the substrate rotation is controlled and a substrate (substrate holder) is rotated intermittently.

FIG. 7A is an explanatory diagram according to the first embodiment where the substrate holder 10 is rotated continuously and the rotational speed of the substrate holder 10 is controlled. FIG. 7B is an explanatory diagram according to the present embodiment where the substrate holder 10 is rotated intermittently and a rotation pause time of the substrate rotation is controlled.

When the substrate holder 10 is rotated continuously, the holder rotation control unit 21 generates a drive signal in accordance with the formula (1), the signal being for continuously changing the rotational speed of the substrate 11 (angular velocity ω) such that modulation of the rotational speed of the substrate 11 can take place in four cycles while the substrate 11 makes a rotation (in one cycle) as presented in FIG. 7A. In other words, the holder rotation control unit 21 controls the rotation of the substrate holder 10 such that the substrate 11 can continuously rotate. In FIG. 7A, f0 denotes a base dose of exposure to an ion beam from the grid 9, and ω denotes a base angular velocity.

On the other hand, when the substrate 11 (substrate holder 10) is rotated intermittently (in a clock form), the holder rotation control unit 21 controls a rotation pause time s as illustrated in FIG. 7B. More specifically, the holder rotation control unit 21 controls the rotation of the substrate holder 10 such that the substrate 11 can stop rotating at two or more predetermined rotational angles and that the rotation unit of the substrate holder 10 can rotate at a fixed angular velocity (rotational speed) at the rotational angles other than the predetermined rotational angles, for example. Under such control, the rotational speed of the substrate 11 is controlled in such a manner as to rotate the substrate 11 intermittently. Incidentally, the rotational speed of the rotation unit of the substrate holder 10 may be fixed as described above, or may be changed instead. Here, in the case where the rotational speed (angular velocity ω) is set on the vertical axis and a time t is set on the horizontal axis, a time period during which the angular velocity is 0 is denoted by a "rotation pause time s". In other words, the rotation pause time s indicates a time period when the rotation of the substrate holder 10 is stopped in the case where the substrate holder 10 is intermittently rotated. Here, $S_0$ is a base rotation pause time.

Also in the present embodiment, essential features are to locate the substrate mounted on the substrate holder with a tilt to the grid 9, and to make large the exposure dose to the ion beam from the extending directions of the pattern trenches as in the first embodiment. As described above, the rotation pause time of the substrate is made longer when the grid 9 is located on the sides in the extending directions of the pattern trenches, thereby effects similar to those of the first embodiment can be obtained. In the present embodiment, while the substrate 11 (substrate holder 10) makes one rotation, the rotation pause time is modulated sinusoidally in four cycles when the grid 9 is located on the sides in the extending directions along the long sides of the patterns, and on the sides in the extending directions along the short sides of the patterns, whereby the rotation pause time on the sides in the extending directions of the pattern trenches (at the substrate rotational positions at 0°, 90°, 180°, and 270°) is made longer. On the other hand, the pause time under the condition where the grid 9 is located on sides in not-extending directions of the pattern trenches is made shorter. Thus, the exposure dose to the ion beam from the extending directions of the pattern trenches is made larger than the exposure dose to the ion beam from the not-extending directions of the pattern trenches. If the etching amount varies between the trenches in the long-side direction and the trenches in the short-side direction, for example, if there is such a shape difference that the trenches on the long sides are shallow whereas the trenches on the short sides are deep, the rotation pause time on the long sides is made further longer to increase the exposure dose to the ion beam. Consequently, the depth of the trenches is made even and fine patterns can be processed uniformly in shape. To make the uniformity in shape favorable, it is preferable to set an equal time for the rotation pause time at rotational positions symmetric with respect to the substrate 11 (for example, at 135° and 315°).

Third Embodiment

In the first and second embodiments, the description is provided for the modes where the rotational speed of the substrate holder 10 is controlled. Instead, in the present embodiment, trenches between fine patterns are processed with control of an incident dose of an ion beam on a substrate taken by controlling supply power to be supplied to plasma generation means from an electric discharge power supply 12. Specifically, in the ion beam etching, the exposure dose to the ion beam is related to a plasma density of plasma generated by the plasma generation unit 2, and the plasma density of the plasma generation unit 2 can be changed by changing the supply power to the plasma generation means. Thus, the exposure dose to the ion beam can be changed according to an angular phase of the substrate 11.

Also in the present embodiment, essential features are to locate the substrate mounted on the substrate holder with a tilt to the grid 9, and to make large the exposure dose to the ion beam from the extending directions of the pattern trenches as in the first embodiment.

Figure 10:
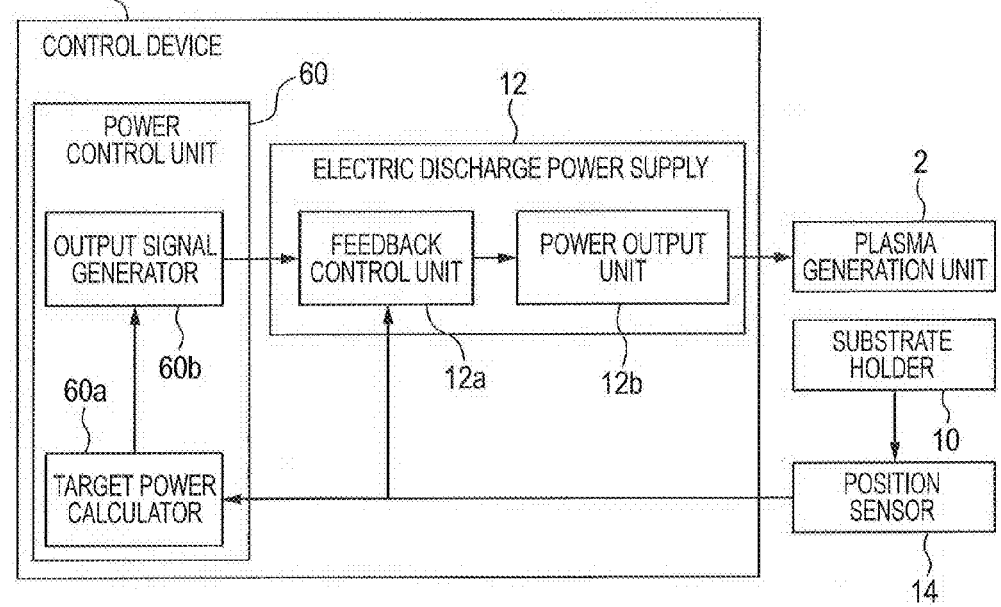
FIG. 10 is a block diagram illustrating a control device according to an embodiment of the present invention.

FIG. 10 is a block diagram of a control device 20 according to the present embodiment. In the present embodiment, the control device 20 includes a power control unit 60 as electric power control means for controlling power (electric power) to be supplied to the plasma generation means according to the rotational position detected by the position sensor 14. The power control unit 60 includes a target power calculator 60a and an output signal generator 60b. The power control unit 60 has a function to control the power (electric power) to the plasma generation means on the basis of the positional relationship between the rotational position of the substrate 11 and the grid 9.

The control device 20 is configured to receive information on the rotational position of the substrate holder 10 from the position sensor 14. When the control device 20 receives the information on the rotational position, the target power calculator 60a calculates a target power (target electric power) for the position, based on a value of the current rotational position of the substrate holder 10 inputted from the position sensor 14 that detects the rotational position of the substrate holder 10. The calculation of the value of the target power is made possible, for example, by storing a correspondence relationship between the rotational position of the substrate holder 10 and the target power as a map in advance into a memory or the like included in the control device 20. Based on the target power calculated by the target power calculator 60a, the output signal generator 60b generates an output signal for adjusting the supply power to the target power, and outputs the output signal to the power supply 12. The control device 20 is configured to send the output signal generated by the output signal generator 60b to the power supply 12.

Note that, in the example of FIG. 10, the power supply 12 includes a power output unit 12b configured to supply electric power to the plasma generation means, and a feedback control unit 12a configured to determine an operation value of the power output unit 12b based on a deviation between the target value and the actual value (rotational position or rotational speed) outputted from the position sensor 14. However, the feedback control is not an essential constituent of the present invention.

Also in the present embodiment, the rotation method of the substrate holder may be continuous rotation as in the first embodiment or may be intermittent pulse rotation as in the second embodiment.

Figure 11A:
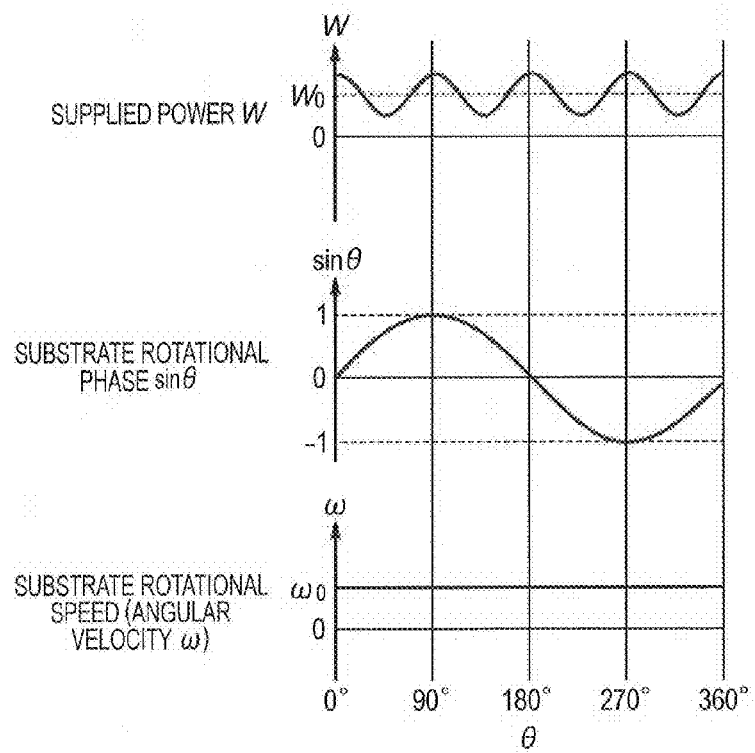
FIG. 11A is an explanatory diagram according to an embodiment of the present invention where electric power to be inputted to a plasma generation unit is controlled and a substrate (substrate holder) is rotated continuously.
Figure 11B:
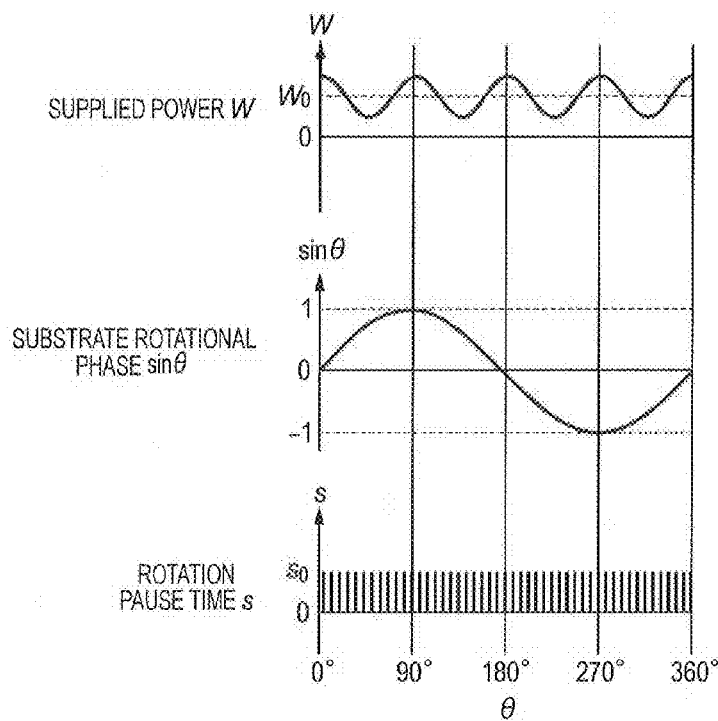
FIG. 11B is an explanatory diagram according to the embodiment of the present invention where the electric power to be inputted to the plasma generation unit is controlled and a substrate (substrate holder) is rotated intermittently.

FIG. 11A is an explanatory diagram according to the present embodiment where the supply power to the plasma generation means is controlled and a substrate (substrate holder) is continuously rotated. FIG. 11B is an explanatory diagram according to the present embodiment where the supply power to the plasma generation means is controlled and a substrate (substrate holder) is intermittently rotated. In the case of the intermittent rotation of the substrate, the control of the exposure dose to the ion beam according to the rotational angle θ may be performed by changing the rotation pause time while the supply power to the plasma generation means is fixed.

In the embodiment according to FIGS. 11A and 11B, the power control unit 60 is able to calculate power for electric discharge according to the rotational angle θ of the substrate 11 by using a sine function which cycles four times more as in Formula (1). More specifically, the power control unit 60 generates an output signal for modulating the supply power to the plasma generation means in four cycles while the substrate 11 (substrate holder 10) makes one rotation (in one cycle). In this process, the supply power to the plasma generation means may be changed smoothly and continuously, or may be changed stepwise. As illustrated in FIGS. 11A and 11B, the power control unit 60 may control the electric discharge power supply 12 such that the power (electric power) supplied at the rotational angles θ=0°, 90°, 180°, and 270° at which the grid 9 is opposed to the sides in the extending directions of the pattern trenches can reach a maximum value to maximize the incident dose of the ion beam on the substrate 11, while the power (electric power) supplied at certain rotational angles other than the foregoing angles can reach a minimum value to minimize the incident dose of the ion beam on the substrate 11.

Thus, in the present embodiment, the effects of the present invention can be produced by locating the substrate mounted on the substrate holder with a tile to the grid 9 and by controlling the electric discharge power supply 12 such that the supply power from the power control unit 60 is increased so as to make large the exposure dose to the ion beam from the extending directions of the pattern trenches. In addition, to make the uniformity in shape favorable, it is preferable to set an equal voltage for an application voltage at rotational positions symmetric with respect to the substrate 11 (for example, at 135° and 315°).

Fourth Embodiment

In the third embodiment, the description provided for the method of improving the uniformity of a processed surface by controlling the supply power to the plasma generation means. In the present embodiment, trenches between fine patterns are processed while a beam extraction voltage is being changed. In ion beam etching, after plasma is generated in the plasma generation unit 2, a beam is formed by extracting ions in the plasma generation unit 2 by means of a voltage applied to the grid 9. In this regard, energy of the ion beam extracted from the plasma generation unit 2 depends on the beam extraction voltage, and therefore the trenches between the fine patterns are processed while the voltage is being changed according to the rotational phase of the substrate.

FIG. 3 illustrates an enlarged view of the grid 9 in FIG. 2. The beam extraction voltage in the present embodiment is explained by using FIG. 3.

In FIG. 3, the upper side is the plasma generation unit 2, and the lower side is the process space 1. The grid 9 includes the first electrode 70, the second electrode 71, and the third electrode 72 arranged in this order when viewed from the plasma generation unit 2 side. FIG. 3 illustrates a state where the ions are extracted by the electrodes from the plasma generated in the plasma generation unit 2, and thereby the ion beam is formed. A positive voltage is applied to the first electrode 70 by a first electrode power supply 73. A negative voltage is applied to the second electrode 71 by a second electrode power supply 74. Since the positive voltage is applied to the first electrode 70, ions are accelerated due to a potential difference from the first electrode 70.

The third electrode 72 is also called an earth electrode and is grounded. By controlling the potential difference between the second electrode 71 and the third electrode 72, an ion beam diameter of the ion beam can be controlled within a predetermined numeric value range by using an electrostatic lens effect.

In the present embodiment, the substrate holder and the third electrode are usually at a grounded potential. For this reason, the ion beam energy is determined depending on the positive voltage applied to the first electrode. Accordingly, in the present embodiment, the voltage applied to the first electrode is a beam extraction voltage. Hereinafter, description is provided for an embodiment in the case where the beam extraction voltage is changed by changing the voltage applied to the first electrode.

Also in the present embodiment, essential features are to locate the substrate 11 mounted on the substrate holder 10 with a tilt to the grid 9, and to make large the exposure dose to the ion beam from the extending directions of the pattern trenches as in all the other embodiments.

Figure 12:
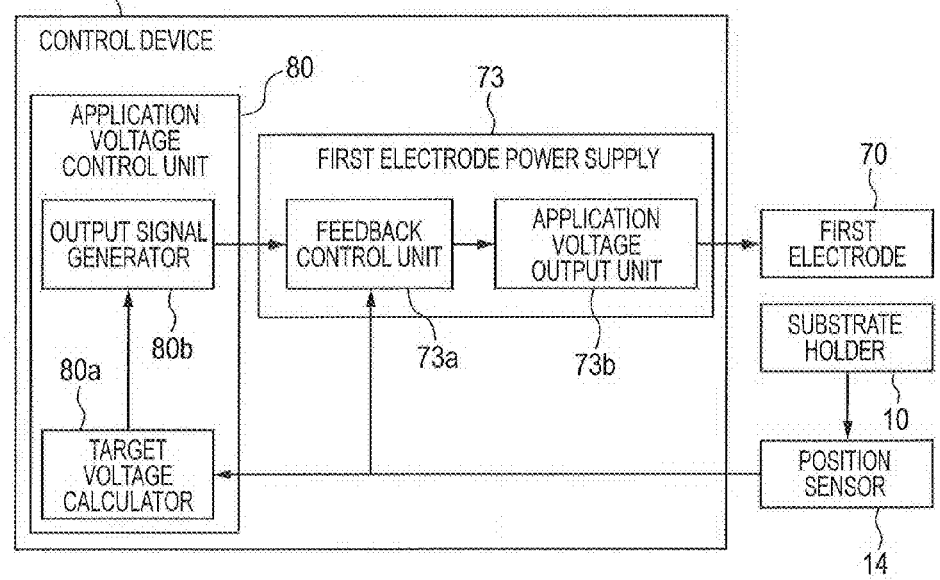
FIG. 12 is a block diagram illustrating a control device according to an embodiment of the present invention.

FIG. 12 is a block diagram of a control device 20 according to the present embodiment. In the present embodiment, the control device 20 includes an application voltage control unit 80 as voltage control means for controlling a voltage (beam extraction voltage) to be applied to the first electrode 70 according to the rotational position detected by the position sensor 14. The application voltage control unit 80 includes a target voltage calculator 80*a* and an output signal generator 80*b* and has a function to control the application voltage to the first electrode 70 on the basis of the positional relationship between the rotational phase of the substrate 11 and the grid 9.

The control device 20 is configured to receive information on the rotational position of the substrate holder 10 from the position sensor 14. When the control device 20 receives the information on the rotational position, the target voltage calculator 80*a* calculates a target voltage for the position based on a value of the current rotational phase of the substrate holder 10 inputted from the position sensor 14 that detects the rotational phase of the substrate holder 10. The calculation of the value of the target voltage is made possible, for example, by storing a correspondence relationship between the rotational position of the substrate holder 10 and the target voltage as a map in advance into a memory or the like included in the control device 20. Based on the target power calculated by the target voltage calculator 80*a*, the output signal generator 80*b* generates an output signal for adjusting the application voltage to the target voltage, and outputs the output signal to the first electrode power supply 73. The control device 20 is configured to send the output signal generated by the output signal generator 80*b* to the first electrode power supply 73.

Note that, in the example of FIG. 12, the first electrode power supply 73 includes an application voltage output unit 73*b* configured to apply a voltage to the first electrode 70, and a feedback control unit 73*a* configured to determine an operation value of the application voltage output unit 73*b* based on a deviation between the target value and the actual value (rotational position or rotational speed) outputted from the position sensor 14. However, the feedback control is not an essential constituent of the present invention.

Also in the present embodiment, the rotation method of the substrate holder may be continuous rotation as in the first embodiment or may be intermittent pulse rotation as in the second embodiment.

Figure 13A:
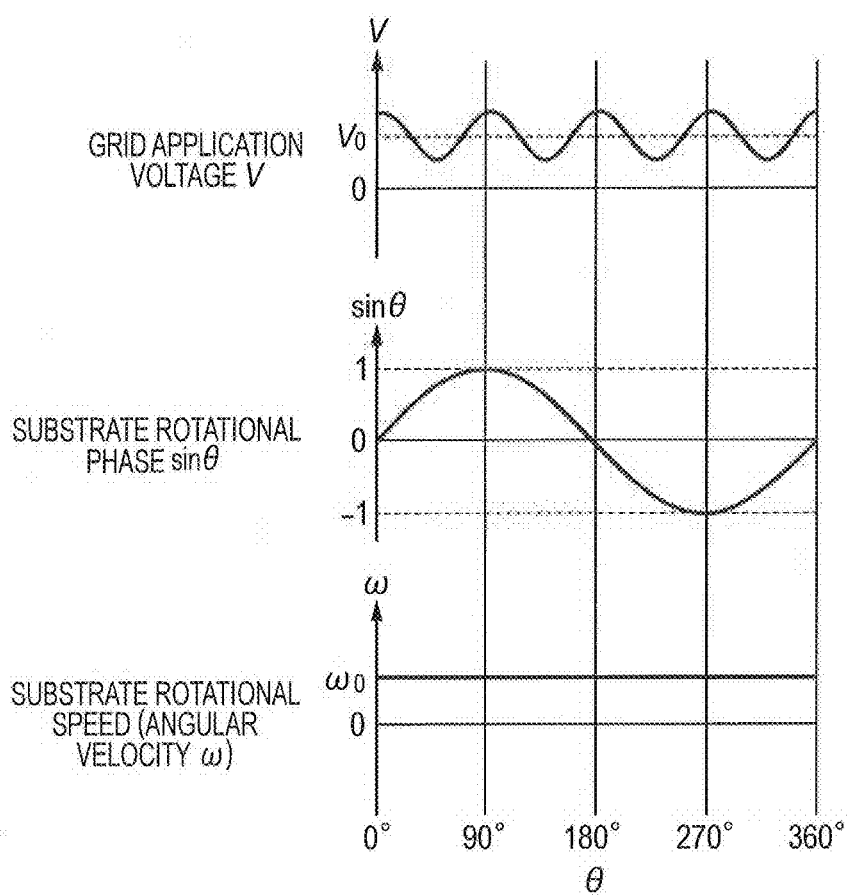
FIG. 13A is an explanatory diagram according to an embodiment of the present invention where a voltage to be applied to a grid is controlled and a substrate (substrate holder) is rotated continuously.
Figure 13B:
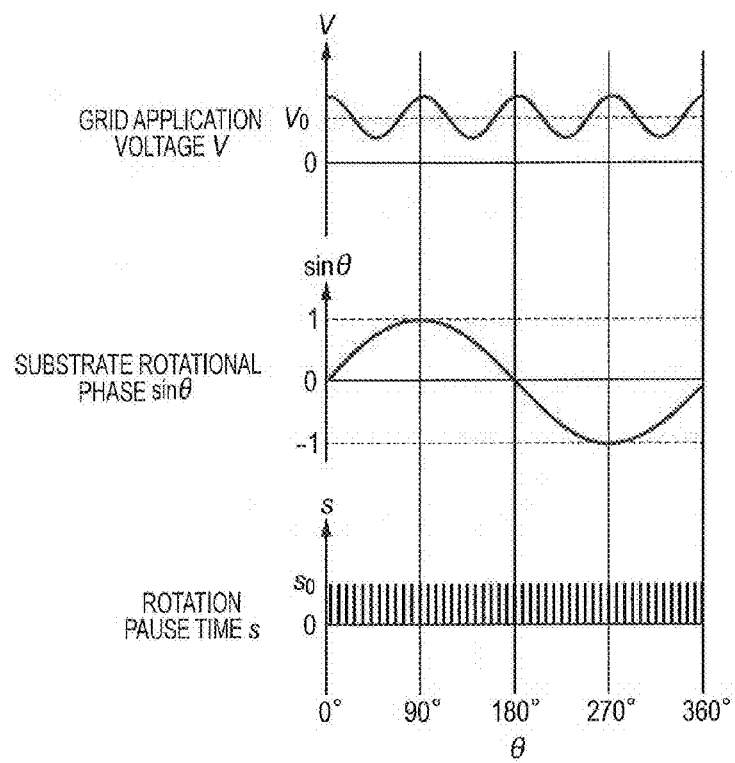
FIG. 13B is an explanatory diagram according to the embodiment of the present invention where the voltage to be applied to the grid is controlled and a substrate (substrate holder) is rotated intermittently.

FIG. 13A is an explanatory diagram according to the present embodiment where the beam extraction voltage (namely, the application voltage to the first electrode 70) is controlled and a substrate (substrate holder) is continuously rotated. FIG. 13B is an explanatory diagram according to the present embodiment where the application voltage to the grid 9 is controlled and a substrate (substrate holder) is intermittently rotated. In the case where the substrate is intermittently rotated, the control of the exposure dose to the ion beam according to the rotational angle θ may be performed by changing the rotation pause time while the application voltage to the grid 9 is fixed.

In the embodiment according to FIGS. 13A and 13B, the application voltage control unit 80 is able to calculate the application voltage according to the rotational angle θ of the substrate 11 by using a sine function which cycles four times more as in Formula (1). More specifically, the application voltage control unit 80 generates an output signal for modulating the beam extraction voltage in four cycles while the substrate 11 (substrate holder 10) makes one rotation (in one cycle). In this process, the beam extraction voltage may be changed smoothly and continuously, or may be changed stepwise. For example, as illustrated in FIGS. 13A and 13B, the application voltage control unit 80 may control the first electrode power supply 73 as follows. Specifically, the voltage applied to the first electrode 70 at the rotational angle θ=0°, 90°, 180°, and 270°, at which the grid 9 is located on the sides in the extending directions of the pattern trenches, may be controlled to reach a maximum value to maximize the ion beam energy, and thereby to make large the incident dose of the ion beam from the extending directions of the pattern trenches. Meanwhile, the voltage applied to the first electrode 70 when the grid 9 is located on the sides in the not-extending directions of the pattern trenches may be controlled to reach a minimum value to minimize the ion beam energy. In the case of minimizing the ion beam energy, the voltage to be applied to the grid 9 may be set to zero to stop exposure of the substrate 11 to the ion beam.

In this way, in the present embodiment, the effects of the present invention can be obtained by locating the substrate mounted on the substrate holder with a tilt to the grid 9, and by the application voltage control unit 80 controlling the application voltage of the first electrode power supply 73 such that the exposure dose to the ion beam from the extending directions of the pattern trenches can be made large. To make the uniformity in shape favorable, it is preferable to set equal power for the supply power at rotational positions symmetric with respect to the substrate 11 (for example, at 135° and 315°).

In the present embodiment, the beam extraction voltage is changed by changing the voltage to be applied to the first electrode. However, the beam extraction voltage may be changed by another method. For example, the beam extraction voltage may be changed with the voltage applied to the third electrode changed by applying a positive voltage lower than that for the first electrode to the third electrode. Instead, an energy of incidence of the ion beam onto a substrate may be changed by changing a voltage to be applied to the substrate holder.

Moreover, in the present embodiment, the grid 9 does not necessarily include three electrodes. This is because an essential point of the present embodiment is to change the energy of the ion beam according to the rotational phase of the substrate as described above.

Fifth Embodiment

An embodiment of the present invention can be combined with another etching method. An example is explained below in which the present invention is combined with reactive ion etching (RIE). As etching means of RIE, there have been known an etching apparatus using capacitively-coupled plasma generated by parallel flat-plate electrodes, and an etching apparatus using inductively-coupled plasma generated by an antenna coil. An advantageous point of RIE is that the RIE does not have limitation on the incident angle of ions unlike the IBE, and therefore is capable of etching an object to be processed by attracting ions into gaps between fine patterns. However, in the case of the foregoing structure including metal films, such as a TMR element for MRAM, physical etching of ions tends to be dominant over etching through chemical reaction. Magnetic metals removed by physical etching are difficult to volatize, and are redeposited onto the side walls of the TMR elements. For this reason, the RIE process on fine patterns is also difficult because the etching products remain on the bottom portions of the pattern trenches as in the conventional IBE process method.

If an IBE process according to an embodiment of the present invention is performed after a RIE process, etching products redeposited on the side walls of the patterns by the RIE can be removed by means of the trimming effect or the bottom portions of the pattern trenches, which are difficult to process, can be processed. Timing for switching between RIE and IBE can be known by performing end point detection using an emission analysis device configured to detect the wavelength of plasma light. In the case where different apparatuses are used for RIE and IBE, the apparatuses installed at different places may be used to process fine patterns by the IBE according to an embodiment of the present invention after performing the RIE process, or a common transportation path may be used to perform these processes without breaking vacuum.

Sixth Embodiment

By use of an embodiment of the present invention, fine patterns processed by another apparatus can be further trimmed with favorable uniformity. A density distribution of plasma can be changed by changing an electric current fed to the electromagnet 8 illustrated in FIG. 2. Specifically, the adjustment of the plasma density distribution uses a solenoid as the electromagnet 8, and the solenoid is installed so as to surround the outer periphery of the bell jar as illustrated in FIG. 2. The solenoid is connected to a DC power supply, not illustrated. When a current is fed to the solenoid, the solenoid generates a magnetic field in accordance with Ampere's circuital law, and forms lines of magnetic force which may scatter electrons concentrically outward from the center of the plasma generation unit. When a small current is fed to the solenoid, the plasma density tends to be high at the center. As the value of the current fed to the solenoid is increased, the plasma density distribution is flattened with outward diffusion. Fine patterns processed by another apparatus are analyzed in terms of a film thickness distribution tendency in a substrate surface by using an atomic force microscope, an optical measuring or scanning electron microscope, or the like, and the current to be fed to the electromagnet 8 is adjusted based on the analysis result. For example, let us consider the case where fine patterns processed by RIE have a large film thickness at a center portion in a substrate, and have a small film thickness at an outer peripheral portion in the substrate. In this case, a current to be fed to the electromagnet is adjusted such that the plasma density at the center can be higher while the plasma density at the outer periphery can be lower. Since the number of particles in the ion beam extracted by the grid 9 is determined in proportion to the plasma density, the etch rate at the center portion with a high ion density is high. In this way, variations among fine patterns after process can be corrected by combining the present invention with an etching process using another etching method. The electromagnet 8 illustrated in FIG. 2 is provided solely. Instead, another electromagnet may be added to outside of the electromagnet 8, and the plasma density may be adjusted by using interactions between the inner and outer electromagnets.

Seventh Embodiment

In an embodiment of the present invention, etching is performed while changing an incident angle. This etching enables removal of redeposited films from many directions, and an enhancement in the trimming effect. In the present embodiment, the substrate 11 mounted on the substrate holder is located with a tilt to the grid 9 so that the incident angle of the ion beam can be aligned with pattern trenches. In addition, the substrate is exposed to the ion beam while changing its tilt angle (for example, the tilt angle is changed from 30° to 20°). By changing the tilt angle of the substrate, the incident angle of the ion beam is changed, which makes it easier to trim the side walls of the patterns and the bottom portions of the trenches.

Figure 16A:
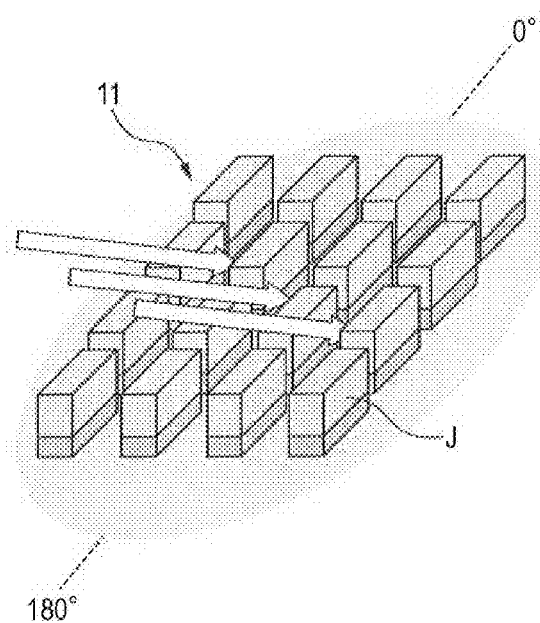
FIG. 16A is a diagram schematically illustrating a state where an ion beam is incident on a substrate in an embodiment of the present invention.
Figure 16B:
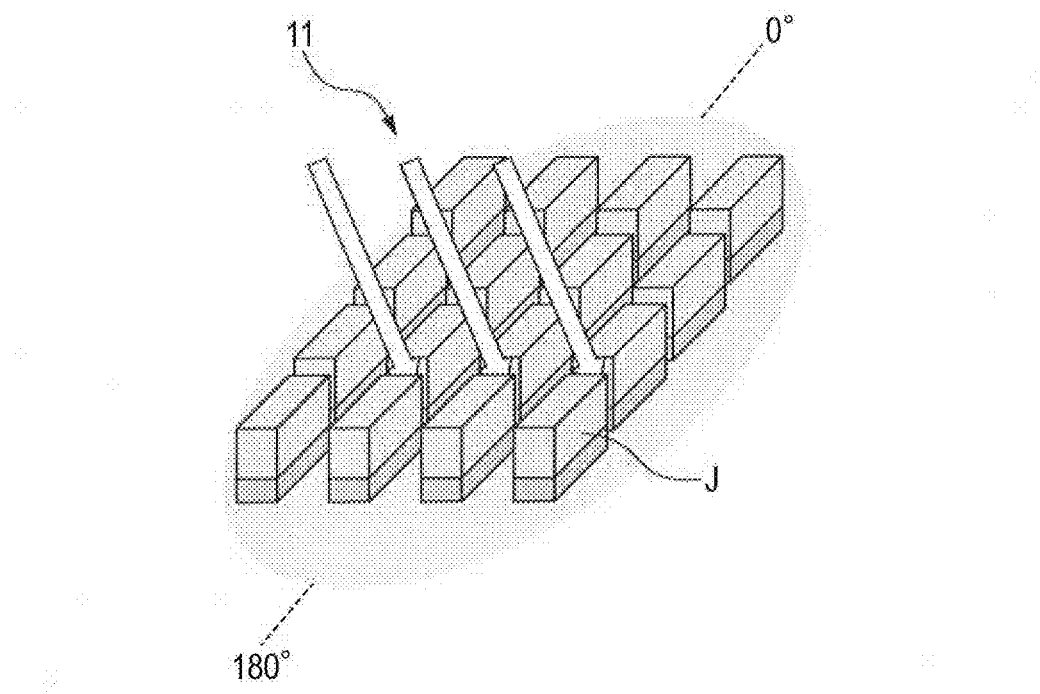
FIG. 16B is a diagram schematically illustrating a state where an ion beam is incident on a substrate in an embodiment of the present invention.

More detailed description is provided by using FIGS. 16A and 16B. FIG. 16A illustrates a state where the ion beam is incident on the substrate 11 with a predetermined tilt. In FIG. 16B, the exposure to the ion beam is performed in a direction more perpendicular to the substrate 11 than the ion beam in FIG. 16A. Such exposure to the ion beam in the more perpendicular direction enables elements J to be etched at an angle different from that of the ion beam in FIG. 16A. More specifically, in the present embodiment, the exposure to the ion beam is started while the substrate 11 is held at a first tilt angle (for example, the state in FIG. 16A). Then, after the substrate 11 makes a predetermined number of rotations, the substrate is changed to be held at a second tilt angle that is different from the first tilt angle (for example, the state in FIG. 6B), and the exposure to the ion beam is continuously performed. The number of tilt angles to be changed over is not limited to two, but may be three or more.

Moreover, the exposure to the ion beam in the more perpendicular direction is also performed such that the exposure dose to the ion beam from the extending directions of the pattern trenches can become larger as in the embodiments described above. This enables the side walls of the elements J to be efficiently exposed to the ion beam as illustrated in FIG. 16B. More specifically, in the state in FIG. 16A, the ion beam is incident in directions almost parallel to the side walls of the elements J, and the incidence in the directions perpendicular to the side walls of the elements J is restricted by the neighboring elements. On the other hand, in the state in FIG. 16B, the incident angle of the ion beam is more perpendicular, and accordingly the incident dose of the ion beam from the directions perpendicular to the side walls of the elements J can be increased. Moreover, by increasing the exposure dose to the ion beam from the extending directions of the pattern trenches, the incident dose of the ion beam from the directions perpendicular to the side walls of the elements J can be made larger than the incident dose of the ion beam from the other directions. As a result, efficient trimming can be performed. The tilt of the substrate may be fixed during a predetermined number of rotations, or may be switched over at shorter intervals by swinging the substrate.

Eighth Embodiment

The foregoing seventh embodiment presents the mode where the tilt angle of the substrate 11 to the grid 9 is changed after a fixed number of rotations or more.

In contrast to this, in the present embodiment, the tilt angle of the substrate 11 to the grid 9 is changed along with the rotational speed of the substrate 11 in the first embodiment. The present embodiment is described below in detail by using FIG. 19.

Figure 19:
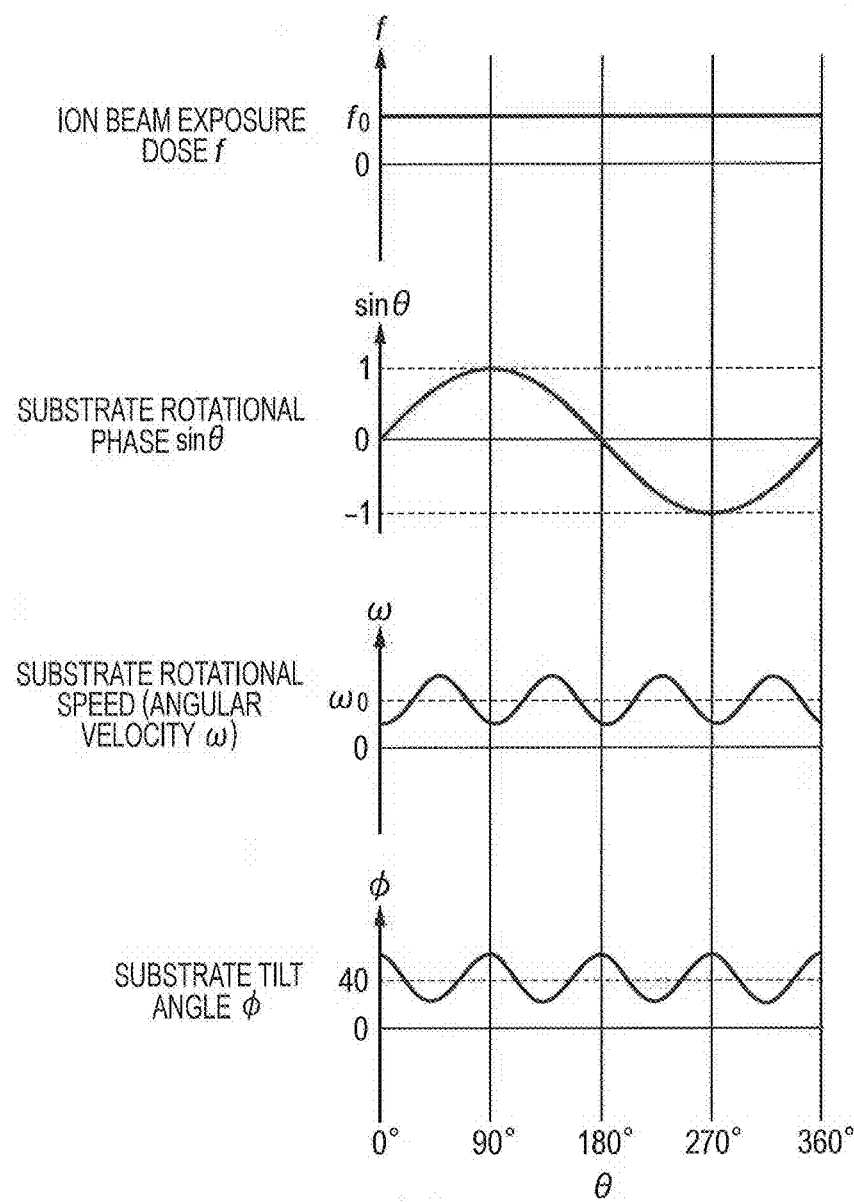
FIG. 19 is a diagram for explaining a relationship among a positional relationship between a grid and a substrate, the phase of the substrate, the rotational speed of the substrate, and a tilt angle of the substrate to the grid according to an embodiment of the present invention.

FIG. 19 presents how the rotational speed of the substrate 11 changes according to its rotational position. In addition, the tilt angle $\Phi$ of the substrate 11 to the grid 9 is changed within a range of 20° to 60° around a base angle of 40°. It is preferable that $\Phi$ become largest when the rotational speed of the substrate 11 becomes lowest, and become smallest when the rotational speed of the substrate 11 becomes highest. By taking such control, when the ion beam is incident along the pattern trenches on the substrate 11, the etching can efficiently remove redeposited films adhered to the side walls of the elements and the like. On the other hand, when the incidence of the ion beam is difficult, the ion beam is made incident at an angle closer to the perpendicular angle, and thereby the etching can be performed while reducing the influence of the shadows of neighboring elements.

Ninth Embodiment

The second embodiment presents the case where the energy amount of the ion beam incident on the substrate is changed in the form of the sine function by changing the rotation pause time in the form of the sine function relative to the phase of the substrate. In contrast to this, in the present embodiment, the substrate rotation is paused only under the condition that the grid 9 is located near to the extending directions of the pattern trenches.

Figure 21:
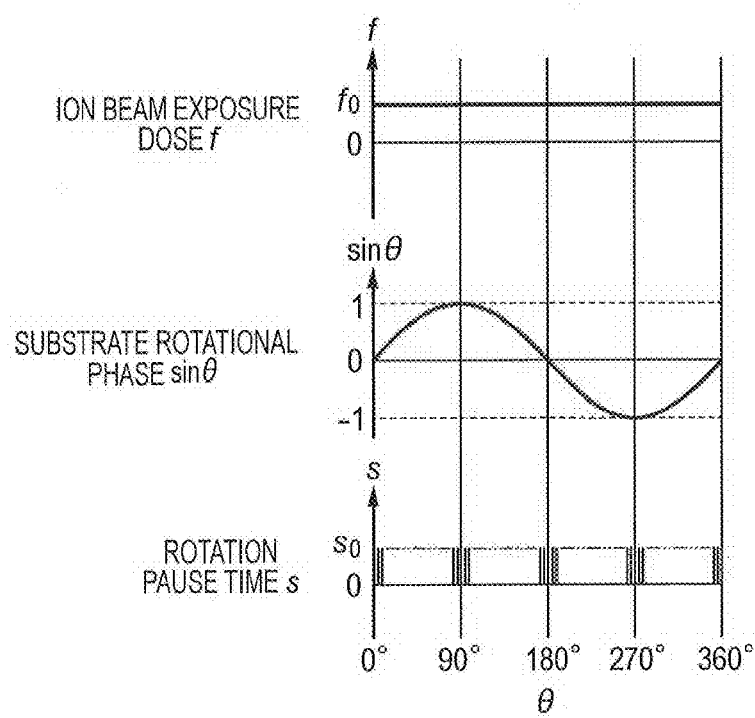
FIG. 21 is a diagram for explaining a relationship among a positional relationship between a grid and a substrate, the phase of the substrate, and a rotation pause time of the substrate according to an embodiment of the present invention.

FIG. 21 presents how the rotation pause time of the substrate 11 changes according to the rotational position. In the present embodiment, the substrate rotation is paused at predetermined rotational angles near to the rotational angles 0°, 90°, 180°, and 270° at which the grid 9 is located in the extending directions of the pattern trenches. After exposure to the ion beam for a fixed time period, the substrate rotation is started again. In a real situation, the side walls of TMR elements after element isolation have a certain tilt angle to the substrate and an ion beam to be incident on the substrate diverges. For this reason, even when the present embodiment is implemented, the redeposited films on the side walls of the elements are exposed to the ion beam.

The pausing of the rotation of the substrate only when the grid 9 is located in the extending directions of the pattern trenches may be further combined with the changing of the exposure dose to the ion beam or the voltage for the ion beam as described in the third embodiment or the fourth embodiment. In this case, the energy amount of the ion beam incident on the substrate is made large only when the grid 9 is located in the extending directions of the pattern trenches, and otherwise the energy amount of the ion beam is made small.

Moreover, the present embodiment may be combined with the changing of the rotational speed as in the first embodiment, or may be combined with the changing of the tilt angle of the substrate as described in the seventh embodiment or the eighth embodiment.

Further, the ion beam etching may be performed while slightly changing the rotational phase of the substrate holder 10 while the grid 9 is located near to the extending directions of the pattern trenches. For example, after the substrate rotation is stopped at each of predetermined rotational angles near to the rotational angles 0°, 90°, 180°, and 270°, the substrate 11 may be exposed to the ion beam while the substrate holder 10 is oscillated in rotational angle within a range of ±10° of the predetermined rotational angle. Such processing with slight movements of the substrate holder 10 enables the surface of the substrate to be processed more uniformly.

The foregoing embodiments of the present invention can be altered variously without departing from the spirit of the present invention.

Figure 14:
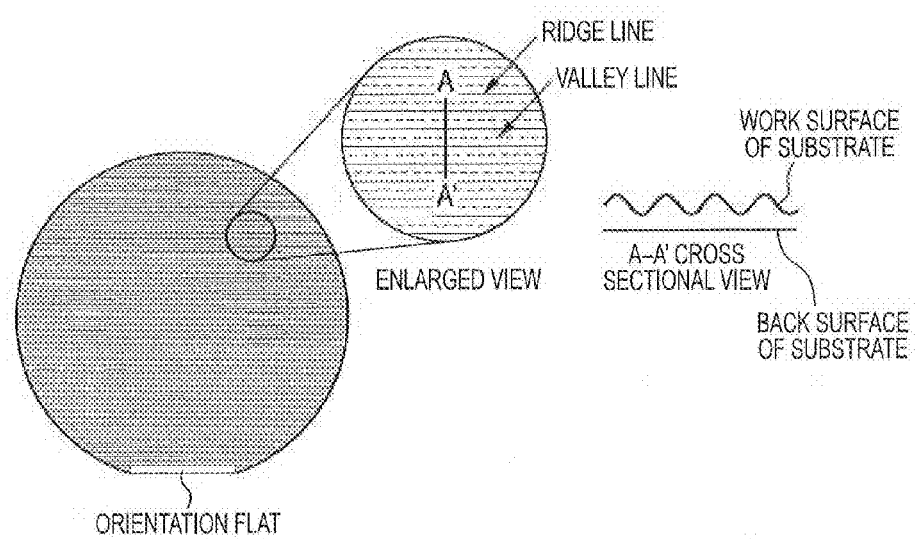
FIG. 14 is a diagram for explaining an example of patterns formed on a substrate to which the present invention is applicable.
Figure 15:
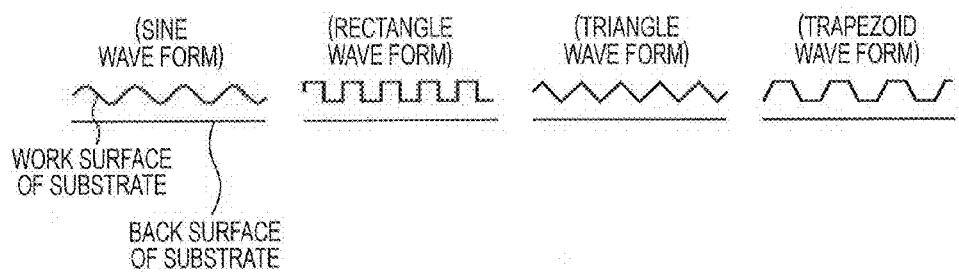
FIG. 15 is a diagram for explaining examples of patterns formed on substrates to which the present invention is applicable.

Besides the above-illustrated patterns in the rectangular parallelepiped shape which are arrayed with the long-side and short-side ends thereof aligned with each other such that the pattern trenches cross each other at perpendicular angles, the foregoing embodiments are also applicable to a discrete track medium or a line-and-space form having a large aspect ratio as illustrated in FIG. 14, or to a process surface of a substrate in any form such as not only a sine wave form, but also a rectangle wave form, a triangle wave form, and a trapezoid wave form as illustrated in FIG. 15.

Figure 20:
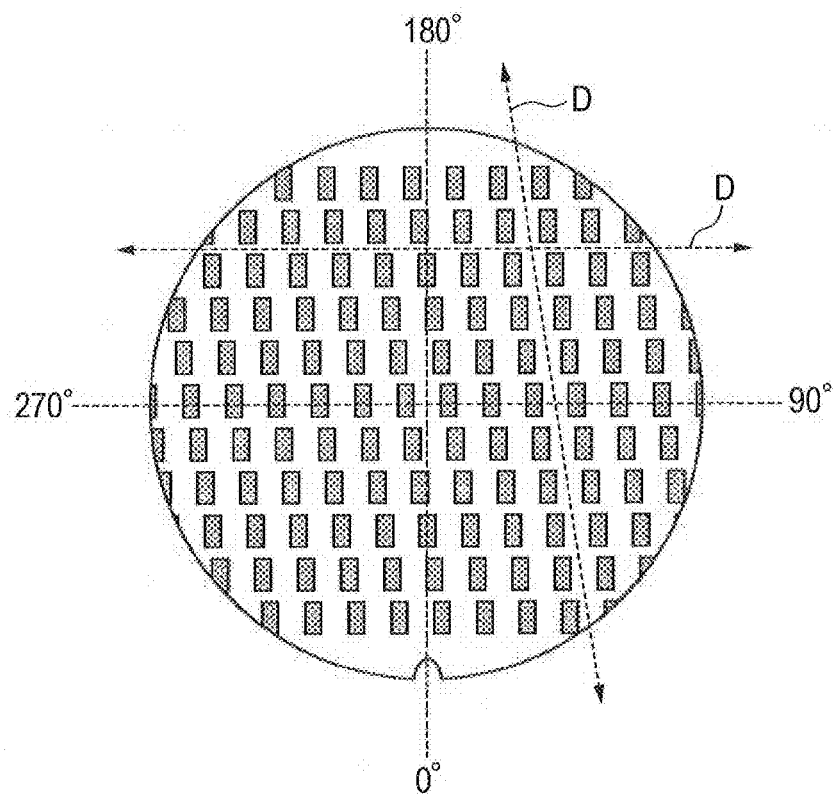
FIG. 20 is a diagram for explaining an example of patterns formed on a substrate to which the present invention is applicable.

In addition, the foregoing embodiments are also applicable to patterns in a rectangular parallelepiped shape which are arrayed with both ends thereof aligned with an oblique direction as illustrated in FIG. 20. In this case, the directions D along the pattern trenches cross each other obliquely at certain angles other than the perpendicular angles. The foregoing embodiments are usable not only on patterns in a rectangular parallelepiped shape, but also patterns in a cylindrical shape.

The embodiments of the present invention are usable in various fields such as magnetic heads for HDD, magnetic recording media for HDD, magnetic sensors, thin film solar cells, light emission elements, piezoelectric elements, and wiring formation for semiconductor elements in addition to the TMR elements for MRAM illustrated above.

The invention claimed is:

1. An ion beam processing method of processing a substrate mounted on a substrate holder by using an ion beam extracted from a plasma source by a grid, the method comprising:
in performing ion beam etching on the substrate located with a tilt to the grid while rotating the substrate in an in-plane direction thereof, performing ion beam processing such that an etching amount of an ion beam incident from an extending direction of a pattern trench formed on the substrate is made larger than an etching amount of an ion beam incident from another direction,
wherein a rotational speed of the substrate when the grid is located on a side in the extending direction of the pattern trench formed on the substrate is made lower than the rotational speed of the substrate when the grid is located on a side in a direction different from the extending direction.

2. An ion beam processing method of processing a substrate mounted on a substrate holder by using an ion beam extracted from a plasma source by a grid, the method comprising:
in performing ion beam etching on the substrate located with a tilt to the grid while rotating the substrate in an in-plane direction thereof, performing ion beam processing such that an etching amount of an ion beam incident from an extending direction of a pattern trench formed on the substrate is made larger than an etching amount of an ion beam incident from another direction,
wherein the rotating the substrate involves a repetition of a rotation of the substrate and a pause of the rotation, and
wherein a rotation pause time of the substrate when the grid is located on a side in the extending direction of the pattern trench formed on the substrate is made longer than the rotation pause time of the substrate when the grid is located on a side in a direction different from the extending direction.

3. An ion beam processing method of processing a substrate mounted on a substrate holder by using an ion beam extracted from a plasma source by a grid, the method comprising:
in performing ion beam etching on the substrate located with a tilt to the grid while rotating the substrate in an in-plane direction thereof, performing ion beam processing such that an etching amount of an ion beam incident from an extending direction of a pattern trench formed on the substrate is made larger than an etching amount of an ion beam incident from another direction,
wherein, by controlling a voltage to be applied to the grid, energy of the ion beam when the grid is located on a side in the extending direction of the pattern trench formed on the substrate is made higher than the energy of the ion beam when the grid is located on a side in a direction different from the extending direction.

4. An ion beam processing method of processing a substrate mounted on a substrate holder by using an ion beam extracted from a plasma source by a grid, the method comprising:
in performing ion beam etching on the substrate located with a tilt to the grid while rotating the substrate in an in-plane direction thereof, performing ion beam processing such that an etching amount of an ion beam incident from an extending direction of a pattern trench formed on the substrate is made larger than an etching amount of an ion beam incident from another direction,
wherein, by controlling electric power to be applied to the plasma source, an ion density in the ion beam when the grid is located on a side in the extending direction of the pattern trench formed on the substrate is made higher than the ion density in the ion beam when the grid is located on a side in a direction different from the extending direction.

5. The ion beam processing method according to claim 1, wherein, by controlling a voltage to be applied to the grid, energy of the ion beam when the grid is located on the side in the extending direction of the pattern trench formed on the substrate is made higher than the energy of the ion beam when the grid is located on a side in a direction different from the extending direction.

6. The ion beam processing method according to claim 1, wherein, by controlling electric power to be applied to the plasma source, an ion density in the ion beam when the grid is located on the side in the extending direction of the pattern trench formed on the substrate is made higher than the ion density in the ion beam when the grid is located on a side in a direction different from the extending direction.

7. The ion beam processing method according to claim 2, wherein, by controlling a voltage to be applied to the grid, energy of the ion beam when the grid is located on the side in the extending direction of the pattern trench formed on the substrate is made higher than the energy of the ion beam when the grid is located on a side in a direction different from the extending direction.

8. The ion beam processing method according to claim 2, wherein, by controlling electric power to be applied to the plasma source, an ion density in the ion beam when the grid is located on the side in the extending direction of the pattern trench formed on the substrate is made higher than the ion density in the ion beam when the grid is located on a side in a direction different from the extending direction.

9. The ion beam processing method according to any one of claims 1-4 or 5-8, wherein a tilt angle of the substrate to the grid formed when the ion beam is incident from the extending direction of the pattern trench formed on the substrate is made larger than the tilt angle of the substrate to the grid formed when the ion beam is incident from another direction.

* * * * *